(12) United States Patent
Yang

(10) Patent No.: US 12,519,014 B2
(45) Date of Patent: Jan. 6, 2026

(54) SEMICONDUCTOR STRUCTURE INCLUDING AN ELECTRODE COVER LAYER OVER A CAPACITOR OF A DYNAMIC RANDOM ACCESS MEMORY (DRAM) FORMED IN A SUBSTRATE, AND A CONTACT STRUCTURE ELECTRICALLY CONNECTED TO THE ELECTRODE COVER LAYER, AND METHOD OF MAKING THE SAME

(71) Applicant: ChangXin Memory Technologies, Inc., Hefei (CN)

(72) Inventor: Cheng-Jer Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 687 days.

(21) Appl. No.: 17/790,471

(22) PCT Filed: Apr. 22, 2022

(86) PCT No.: PCT/CN2022/088471
§ 371 (c)(1),
(2) Date: Jun. 30, 2022

(87) PCT Pub. No.: WO2023/279808
PCT Pub. Date: Jan. 12, 2023

(65) Prior Publication Data
US 2024/0170329 A1    May 23, 2024

(30) Foreign Application Priority Data

Jul. 5, 2021 (CN) .......................... 202110758465.3

(51) Int. Cl.
*H01L 21/768* (2006.01)
*H01L 23/532* (2006.01)
(Continued)

(52) U.S. Cl.
CPC .... *H01L 21/7687* (2013.01); *H01L 21/76805* (2013.01); *H01L 21/76844* (2013.01);
(Continued)

(58) Field of Classification Search
CPC ........... H01L 21/7687; H01L 21/76805; H01L 21/76844; H01L 21/76846;
(Continued)

(56) References Cited

U.S. PATENT DOCUMENTS 5,773,314 A * 6/1998 Jiang .................. H01L 28/60
257/E21.582
2009/0072286 A1  3/2009 Noda
(Continued)

FOREIGN PATENT DOCUMENTS

CN        1637566 A     7/2005
CN      109065501 A    12/2018
(Continued)

*Primary Examiner* — Sue A Purvis
(74) *Attorney, Agent, or Firm* — Kilpatrick Townsend & Stockton LLP

(57) ABSTRACT

A semiconductor structure includes: an electrode cover layer; a first conductive structure on the electrode cover layer; a contact structure, including a first and a first contact layer. The first contact layer is in contact with the first conductive structure, the bottom of the second contact layer is in contact with the top of the first contact layer, the width of the first contact layer is greater than the width of the bottom of the second contact layer, the lower surface of the contact structure is not lower than the lower surface of the electrode cover layer, and the resistivity of the first conductive structure is not greater than that of the contact structure and is not greater than that of the electrode cover layer.

18 Claims, 15 Drawing Sheets

(51) Int. Cl.
*H01L 23/535* (2006.01)
*H10B 12/00* (2023.01)

(52) U.S. Cl.
CPC .. *H01L 21/76846* (2013.01); *H01L 21/76895* (2013.01); *H01L 23/53266* (2013.01); *H01L 23/535* (2013.01); *H10B 12/30* (2023.02)

(58) Field of Classification Search
CPC ......... H01L 21/76895; H01L 23/53266; H01L 23/535; H01L 23/5226; H01L 23/48; H01L 23/481; H01L 23/5283; H10B 12/30; H10B 12/00
See application file for complete search history.

(56) References Cited

U.S. PATENT DOCUMENTS

| | | | | |
|---|---|---|---|---|
| 2015/0303191 A1* | 10/2015 | Feng | ................... | H01L 27/0629 |
| | | | | 438/243 |
| 2015/0380480 A1* | 12/2015 | Ozawa | ................ | H01L 23/5226 |
| | | | | 257/296 |
| 2023/0197654 A1* | 6/2023 | Gomes | ................... | H01L 24/08 |
| | | | | 257/296 |

FOREIGN PATENT DOCUMENTS

| | | |
|---|---|---|
| CN | 113053807 A | 6/2021 |
| KR | 2003-0008272 A | 1/2003 |

* cited by examiner

SEMICONDUCTOR STRUCTURE INCLUDING AN ELECTRODE COVER LAYER OVER A CAPACITOR OF A DYNAMIC RANDOM ACCESS MEMORY (DRAM) FORMED IN A SUBSTRATE, AND A CONTACT STRUCTURE ELECTRICALLY CONNECTED TO THE ELECTRODE COVER LAYER, AND METHOD OF MAKING THE SAME

CROSS REFERENCE

The present application claims the priority of a Chinese patent with an application number of 202110758465.3 and entitled of "Semiconductor Structure and Method of Making the Same", filed with the China National Intellectual Property Administration on Jul. 5, 2021, the entire contents of which are incorporated by reference in its entirety herein.

TECHNICAL FIELD

Embodiments of the present disclosure relate to the technical field of integrated circuits, and in particular, to a semiconductor structure and a method for fabricating the same.

BACKGROUND

The metal interconnection layers of the dynamic random access memory (DRAM) lead to the upper electrode covering layer of the capacitor through the contact structure in the through-hole. In a typical fabrication process, the through-hole will penetrate deep into the electrode covering layer, so as to meet the purpose of reducing the contact resistance between the contact structure in the through-hole and the upper electrode covering layers of the capacitors. However, when the through-hole is too large, different from the adjacent pattern structure, the problem of loading effect or contact structure depression is prone to occur in the chemical polishing process; if the through-hole is too small, voids will appear in the contact structure, resulting in a sharp increase in contact resistance.

SUMMARY

According to various embodiments of the present disclosure, a semiconductor structure and a method for fabricating the same are provided.

According to some embodiments, embodiments of the present disclosure provide a semiconductor structure comprising:
  an electrode cover layer on the substrate;
  a first conductive structure, located on the upper surface of the electrode covering layer,
  wherein the contact structure includes a first contact layer and a second contact layer, the first contact layer is in contact with the first conductive structure, the bottom of the second contact layer is in contact with the top of the first contact layer; the width of the first contact layer is greater than that of the first contact layer. The width of the bottom of the second contact layer; and
  wherein, the lower surface of the contact structure is not lower than the lower surface of the electrode covering layer, and the resistivity of the first conductive structure is not greater than that of the contact structure and is not greater than that of the electrode covering layer.

According to some embodiments, the first contact layer is located on the upper surface of the first conductive structure, and the thermal expansion coefficient of the first contact layer is not greater than the thermal expansion coefficient of the first conductive structure.

According to some embodiments, the semiconductor structure further includes an insulating layer on the upper surface of the first conductive structure;
  wherein the first contact layer includes a first conductive layer and a first barrier layer, the first conductive layer is located in the insulating layer, and the first barrier layer is located between the first conductive layer and the insulating layer and between the first conductive layer and the first conductive structure; and
  wherein the second contact layer includes a second conductive layer and a second barrier layer, the second conductive layer is located in the insulating layer, and the second barrier layer is located between the second conductive layer and the insulating layer and between the second conductive layer and the first conductive layer.

According to some embodiments, the first contact layer is located on the lower surface of the first conductive structure; the semiconductor structure further includes an insulating layer, and the insulating layer is located on the upper surface of the first conductive structure;
  wherein the first contact layer includes a first conductive layer and a first barrier layer, the first conductive layer is located in the electrode cover layer, and the first barrier layer is located between the first conductive layer and the electrode cover layer;
  wherein the second contact layer includes a second conductive layer and a second barrier layer, the second conductive layer includes a portion located in the insulating layer and a portion located in the first conductive structure, and the second barrier layer is located between the second conductive layer and the insulating layer, between the second conductive layer and the first conductive structure, and between the second conductive layer and the first conductive layer.

According to some embodiments, the electrode cover layer includes:
  an electrode covering structure, located on the substrate;
  wherein the adhesion structure is located on the upper surface of the electrode covering structure.

According to some embodiments, the lower surface of the first contact layer is higher than the lower surface of the adhesive structure, the first conductive layer is located within the adhesive structure, and the first barrier layer is located between the first conductive layer and the adhesive structure;
  wherein, the doping concentration of the adhesion structure is not less than the doping concentration of the electrode covering structure, and the doping concentration of the first conductive structure is not greater than the doping concentration of the adhesion structure.

According to some embodiments, the lower surface of the first contact layer is flush with the lower surface of the adhesive structure, the first conductive layer is located within the adhesive structure, the first barrier layer is located between the first conductive layer and the adhesive structure and the third between a conductive layer and the electrode covering structure.

According to some embodiments, the lower surface of the first contact layer is lower than the lower surface of the adhesive structure, the first conductive layer includes a portion located in the adhesive structure and a portion located in the electrode covering structure, and the first barrier layer is located in the first conductive layer between the layer and the adhesion structure and between the first conductive layer and the electrode covering structure.

According to some embodiments, the semiconductor structure further includes:
- a metal wiring layer, the metal wiring layer is located on the contact structure and is in contact with the top of the contact structure;
- a first conductive structure, wherein the first conductive layer, and the second conductive layer are all first material layers, and the first material layer at least includes one of a tungsten material layer, a tungsten-silicon material layer, a tungsten nitride material layer, and a tungsten-silicon nitride material layer.

According to some embodiments of the present disclosure, a method for fabricating a semiconductor structure includes:
- forming an electrode covering layer on the substrate;
- forming a first conductive structure on the upper surface of the electrode covering layer;
- forming an insulating layer on the first conductive structure, and forming a contact structure in the insulating layer;

The contact structure includes a first contact layer and a second contact layer, the first contact layer is in contact with the first conductive structure, the bottom of the second contact layer is in contact with the top of the first contact layer; the width of the first contact layer is greater than The width of the bottom of the second contact layer; the lower surface of the contact structure is not lower than the lower surface of the electrode cover layer, and the resistivity of the first conductive structure is not greater than that of the contact structure and not greater than that of the electrode cover layer.

According to some embodiments, the insulating layer includes a first insulating layer and a second insulating layer, the insulating layer is formed on the first conductive structure, and the step of forming the contact structure in the insulating layer includes:
- forming a first insulating layer on the upper surface of the first conductive structure;
- forming a first contact hole in the first insulating layer;
- forming the first contact layer in the first contact hole;
- forming a second insulating layer on the upper surface of the first insulating layer and the upper surface of the first contact layer;
- forming a second contact hole in the second insulating layer, the second contact hole exposes the first contact layer, and the width of the bottom of the second contact hole is smaller than the width of the first contact layer;
- A second contact layer is formed in the second contact hole.

According to some embodiments, the method of fabricating the semiconductor structure further includes:
- forming a metal connection layer on the insulating layer, and the metal connection layer is in contact with the top of the contact structure;

The first conductive structure, the first contact layer, and the second contact layer are all first material layers, and the first material layer at least includes a tungsten material layer, a tungsten-silicon material layer, a tungsten nitride material layer, and a tungsten-silicon nitride material layer One of: the thermal expansion coefficient of the first contact layer is not greater than the thermal expansion coefficient of the first conductive structure.

According to some embodiments of the present disclosure, a method for fabricating a semiconductor structure, including:
- forming an electrode covering layer on the substrate;
- forming a first contact layer in the electrode covering layer;
- forming a first conductive structure on the upper surface of the electrode covering layer and the upper surface of the first contact layer;
- forming an insulating layer on the first conductive structure;
- forming a second contact layer in the insulating layer and the first conductive structure, the bottom of the second contact layer is in contact with the top of the first contact layer;

The contact structure includes a first contact layer and a second contact layer, the width of the first contact layer is greater than the width of the bottom of the second contact layer; the lower surface of the contact structure is not lower than the lower surface of the electrode covering layer, and the width of the first conductive structure The resistivity is not greater than the resistivity of the contact structure, and is not greater than the resistivity of the electrode covering layer.

According to some embodiments, the electrode cover layer includes: an electrode cover structure and an adhesion structure stacked in sequence from a substrate, and the step of forming the electrode cover layer on the substrate includes:
- forming an electrode covering structure on the substrate;
- An adhesion structure is formed on the upper surface of the electrode covering structure.

According to some embodiments, the step of forming the first contact layer within the electrode cap layer includes:
- forming a first contact hole in the adhesive structure, the bottom of the first contact hole is higher than the lower surface of the adhesive structure;
- forming a first contact layer in the first contact hole;

The doping concentration of the adhesion structure is not less than the doping concentration of the electrode covering structure, and the doping concentration of the first conductive structure is not greater than the doping concentration of the adhesion structure.

According to some embodiments, the step of forming the first contact layer within the electrode cap layer includes:
- forming a first contact hole in the adhesive structure, and the first contact hole exposes the upper surface of the electrode covering structure;
- A first contact layer is formed in the first contact hole.

According to some embodiments, the step of forming the first contact layer within the electrode cap layer includes:
- forming a first contact hole in the adhesion structure and the electrode cover structure, the first contact hole penetrates the adhesion structure and extends into the electrode cover layer;
- A first contact layer is formed in the first contact hole.

According to some embodiments, the method of fabricating the semiconductor structure further includes:
- forming a metal connection layer on the insulating layer, and the metal connection layer is in contact with the top of the contact structure;

The first conductive structure, the first contact layer, and the second contact layer are all first material layers, and the first material layer at least includes a tungsten material layer, a tungsten-silicon material layer, a tungsten nitride material layer, and a tungsten-silicon nitride material layer One of;

the thermal expansion coefficient of the first contact layer is not greater than the thermal expansion coefficient of the first conductive structure.

Embodiments of the present disclosure at least have the following advantages:

The semiconductor structure of the embodiment of the present disclosure includes an electrode cover layer on a substrate, a first conductive structure located on an upper surface of the electrode cover layer; a contact structure including a first contact layer and a second contact layer, the first contact layer and the first contact layer The conductive structures are in contact, the bottom of the second contact layer is in contact with the top of the first contact layer; the width of the first contact layer is greater than the width of the bottom of the second contact layer, and the lower surface of the contact structure is not lower than the lower surface of the electrode covering layer, the resistivity of the first conductive structure is not greater than the resistivity of the contact structure, and is not greater than the resistivity of the electrode covering layer. Compared with directly forming the contact structure in contact with the electrode cover layer, the contact area between the contact structure and the electrode cover layer is increased, and at the same time, the formation of voids in the contact structure is avoided, and the contact resistance is reduced. At the same time, the contact structure is in contact with the electrode cover layer through the first conductive structure whose resistivity is not greater than that of the contact structure and not greater than that of the electrode cover layer, thereby reducing the gap between the contact structure and the capacitance structure under the electrode cover layer body resistance. In addition, the first contact layer in contact with the first conductive structure plays a supporting role during the chemical mechanical polishing process, avoiding the problem of load effect or concave contact structure.

The method for fabricating a semiconductor structure according to an embodiment of the present disclosure includes forming an electrode cover layer on a substrate; forming a first conductive structure on the upper surface of the electrode cover layer; forming an insulating layer on the first conductive structure, and forming a contact in the insulating layer structure; wherein, the contact structure includes a first contact layer and a second contact layer, the first contact layer is in contact with the first conductive structure, and the bottom of the second contact layer is in contact with the top of the first contact layer; The width is greater than the width of the bottom of the second contact layer; the lower surface of the contact structure is not lower than the lower surface of the electrode covering layer, and the resistivity of the first conductive structure is not greater than that of the contact structure and that of the electrode covering layer. Compared with directly forming the contact structure in contact with the electrode cover layer, the contact area between the contact structure and the electrode cover layer is increased, and at the same time, the formation of voids in the contact structure is avoided, and the contact resistance is reduced. At the same time, the contact structure is in contact with the electrode cover layer through the first conductive structure whose resistivity is not greater than that of the contact structure and not greater than that of the electrode cover layer, thereby reducing the gap between the contact structure and the capacitance structure under the electrode cover layer body resistance. In addition, the first contact layer in contact with the first conductive structure plays a supporting role during the chemical mechanical polishing process, avoiding the problem of load effect or concave contact structure.

The method for fabricating a semiconductor structure according to an embodiment of the present disclosure includes forming a first contact layer in an electrode covering layer; forming a first conductive structure on the upper surface of the electrode covering layer and the upper surface of the first contact layer; and forming a first conductive structure on the first conductive structure forming an insulating layer; forming a second contact layer in the insulating layer and the first conductive structure, the bottom of the second contact layer is in contact with the top of the first contact layer; wherein, the contact structure includes a first contact layer and a second contact layer, The first contact layer is in contact with the first conductive structure, and the bottom of the second contact layer is in contact with the top of the first contact layer, the width of the first contact layer is greater than the width of the bottom of the second contact layer; the lower surface of the contact structure is not low On the lower surface of the electrode covering layer, the resistivity of the first conductive structure is not greater than that of the contact structure, and is not greater than that of the electrode covering layer. Increase the contact area between the contact structure and the electrode cover layer, and provide process redundancy for the etching process for forming the second contact layer, avoid the etching process for forming the second contact layer to etch the electrode cover layer, and reduce the contact structure and the electrode cover layer. Bulk resistance between capacitive structures beneath the electrode overlay. In addition, the first contact layer in contact with the first conductive structure plays a supporting role in the chemical mechanical polishing process, avoiding the problem of load effect or depression of the contact structure.

The details of one or more of the embodiments are set forth in the accompanying drawings and the description below. Other features, objects, and advantages of embodiments of the present disclosure will become apparent from the description, drawings, and claims.

BRIEF DESCRIPTION OF THE DRAWINGS

To explain the embodiments of the present disclosure more clearly, the following briefly introduces the accompanying drawings used in the description of the embodiments. Obviously, the accompanying drawings in the following description only cover some embodiments of the present disclosure. For those of ordinary skill in the art, the drawings of other embodiments can also be obtained according to these drawings without creative effort.

DETAILED DESCRIPTION OF THE PREFERRED EMBODIMENTS

Figure 1:
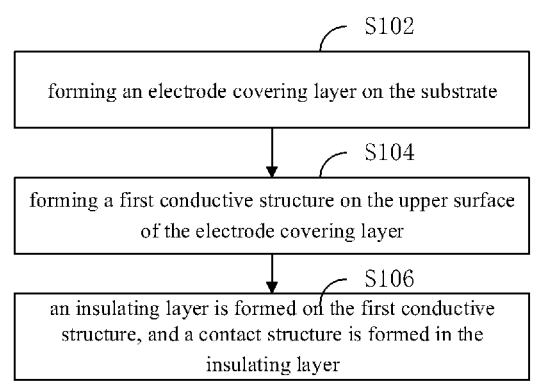
FIG. 1 is a schematic flowchart of a method for fabricating a semiconductor structure according to a first embodiment of the present disclosure.

In order to facilitate the understanding of the embodiments of the present disclosure, a more comprehensive description of the embodiments of the present disclosure will be made below with reference to the related drawings. Preferred embodiments are presented in the accompanying drawings. However, embodiments of the present disclosure may be implemented in many different forms and are not limited to the embodiments described herein. Rather, these embodiments are provided so that the embodiments of the present disclosure will be thorough and complete.

Unless otherwise defined, all technical and scientific terms used herein have the same meaning as commonly understood by one of ordinary skill in the art to which the embodiments of the present disclosure belong. The terms used herein in the description of the embodiments of the present disclosure are only for the purpose of describing specific embodiments, and are not intended to limit the embodiments of the present disclosure.

It will be understood that when an element or layer is referred to as being "on," "adjacent to," it can be directly on, adjacent to the other element or layer, or it may be present Intervening elements or layers. In contrast, when an element is referred to as being "on", there are no intervening elements or layers present. It will be understood that although the terms first, second, third, etc. may be used to describe various elements, components, regions, layers, doping types and/or sections, these elements, components, regions, layers, doping types and/or Sections should not be limited by these terms. These terms are only used to distinguish one element, component, region, layer, doping type or section from another element, component, region, layer, doping type or section. Thus, a first element, component, region, layer, doping type or section discussed below could be termed a second element, component, region, layer or section without departing from the teachings of the embodiments of the present disclosure; for example, Without departing from the scope of the presently disclosed embodiments, the first contact layer may be referred to as the second contact layer, and similarly, the first conductive layer may be referred to as the second conductive layer; the first conductive layer and the second conductive layer The conductive layers are both conductive layers, but they are not the same conductive layer.

Spatial relational terms such as "under", "below", "below", "under", "above", "above", etc., in This may be used to describe the relationship of one element or feature to other elements or features shown in the figures. It should be understood that in addition to the orientation shown in the figures, the spatially relative terms encompass different orientations of the device in use and operation. For example, if the device in the figures is turned over, elements or features described as "below" or "beneath" or "beneath" other elements or features would then be oriented "above" the other elements or features. Thus, the exemplary terms "below" and "under" can encompass both an orientation of above and below. In addition, the device may also be otherwise oriented (e.g., rotated 90 degrees or at other orientations) and the spatial descriptors used herein interpreted accordingly.

As used herein, the singular forms "a," "an," and "the" can include the plural forms as well, unless the context clearly dictates otherwise. It will also be understood that when the terms "compose" and/or "comprise" are used in this specification, the presence of stated features, integers, steps, operations, elements and/or components may be identified, but not excluding one or more other The presence or addition of features, integers, steps, operations, elements, parts and/or groups. Also, as used herein, the term "and/or" includes any and all combinations of the associated listed items. In the description of the embodiments of the present disclosure, "plurality" means at least two, such as two, three, etc., unless otherwise expressly and specifically defined. In the description of the embodiments of the present disclosure, "several" means at least one, such as one, two, etc., unless otherwise expressly and specifically defined.

Embodiments of the invention are described herein with reference to cross-sectional illustrations that are schematic illustrations of idealized embodiments (and intermediate structures) of embodiments of the present disclosure, such that variations in the shapes shown may be contemplated due, for example, to manufacturing techniques and/or tolerances. Thus, embodiments should not be limited to the particular shapes of the regions shown herein, but include shape deviations due, for example, to manufacturing techniques. For example, an implanted region shown as a rectangle typically has rounded or curved features and/or a gradient of implant concentration at its edges rather than a binary change from implanted to non-implanted region.

Likewise, a buried region formed by implantation may result in some implantation in the region between the buried region and the surface over which the implantation proceeds. Thus, the regions shown in the figures are schematic in nature and their shapes do not represent the actual shapes of regions of a device, and do not limit the scope of embodiments of the present disclosure.

Referring to FIGS. 1-15. It should be noted that the drawings provided in the embodiments of the present disclosure are only used to illustrate the basic concept of the disclosed embodiments in a schematic way, although the drawings only show components related to the disclosed embodiments rather than the number of components in actual implementation, shape and size, the type, quantity and proportion of each component can be arbitrarily changed during actual implementation, and the component layout may also be more complicated.

FIG. 1 is a schematic flowchart of a method for fabricating a semiconductor structure in a first embodiment of the present disclosure. Referring to FIG. 1, in the embodiment of the present disclosure, the method for fabricating a semiconductor structure includes:

S102, forming an electrode covering layer on the substrate.

Specifically, an electrode cover layer is formed on the substrate, and the electrode cover layer covers the capacitor structure formed in the substrate. Exemplarily, the material of the electrode covering layer includes at least one of boron-doped polysilicon material and boron-doped silicon germanium material.

S104, forming a first conductive structure on the upper surface of the electrode covering layer.

Specifically, the first conductive structure is formed on the upper surface of the electrode capping layer using a deposition process well known to those skilled in the art. Exemplarily, the material of the first conductive structure includes at least one of tungsten, tungsten nitride, and tungsten silicide.

S106, an insulating layer is formed on the first conductive structure, and a contact structure is formed in the insulating layer.

In the embodiment of the present disclosure, an insulating layer is formed on the upper surface of the first conductive structure, and a contact structure is formed in the insulating layer. Specifically, the contact structure includes a first contact layer and a second contact layer, and the first contact layer is connected to the first contact layer. The conductive structures are in contact, and the bottom of the second contact layer is in contact with the top of the first contact layer; the width of the first contact layer is greater than the width of the bottom of the second contact layer. Further, the lower surface of the contact structure is not lower than the lower surface of the electrode covering layer, the resistivity of the first conductive structure is not greater than that of the contact structure, and further, the resistivity of the first conductive structure is not greater than that of the electrode covering layer. resistivity.

Compared with directly forming the contact structure in contact with the electrode cover layer, the contact area between the contact structure and the electrode cover layer is increased in the embodiment of the present disclosure, and the contact resistance is reduced. At the same time, the formation of voids in the contact structure is avoided, and the contact structure is in contact with the electrode cover layer through the first conductive structure whose resistivity is not greater than that of the contact structure and is not greater than that of the electrode cover layer, thereby reducing the contact structure and the electrode cover. The bulk resistance between the capacitive structures below the layer, and the thickness of the contact structure (distance between the lower surface and the upper surface of the contact structure). In addition, the first contact layer in contact with the first conductive structure plays a supporting role in the chemical mechanical polishing process, avoiding the problem of load effect or depression of the contact structure.

Figure 2:
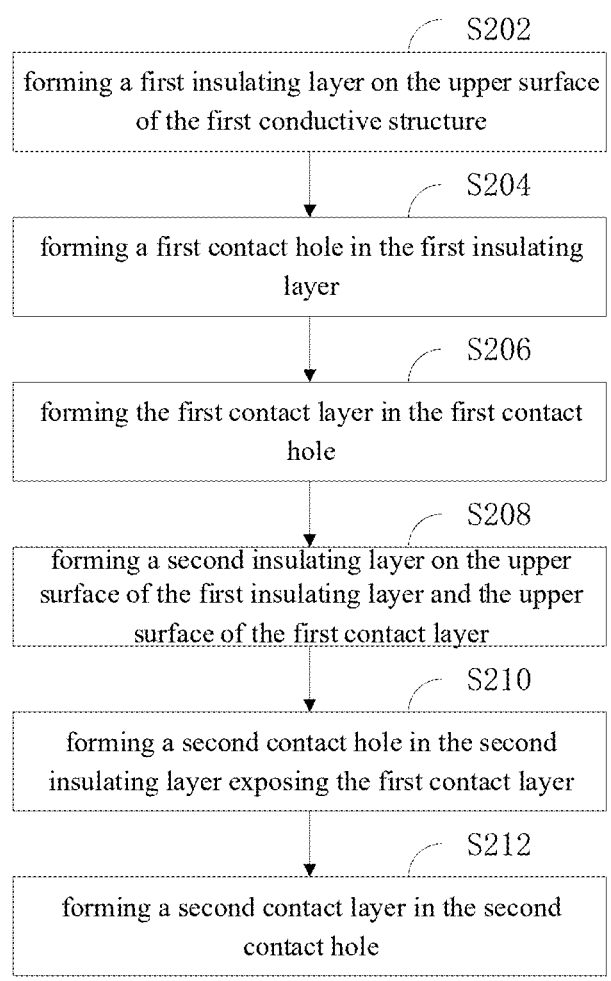
FIG. 2 is a schematic flowchart of step S106 for the method in an embodiment of the present disclosure.

FIG. 2 is a schematic flowchart of step S106 in an embodiment of the present disclosure. Referring to FIG. 2, in the embodiment of the present disclosure, the insulating layer includes a first insulating layer and a second insulating layer, and step S106 includes:

S202, forming a first insulating layer on the upper surface of the first conductive structure;

S204, forming a first contact hole in the first insulating layer;

S206, forming the first contact layer in the first contact hole;

S208, forming a second insulating layer on the upper surface of the first insulating layer and the upper surface of the first contact layer;

S210, forming a second contact hole in the second insulating layer exposing the first contact layer; and S212, forming a second contact layer in the second contact hole.

Figure 3:
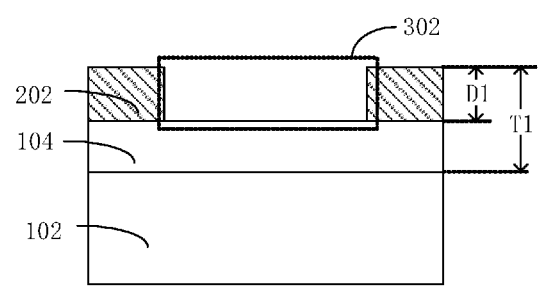
FIG. 3 is a schematic cross-sectional view of a semiconductor structure after forming a first contact hole in a method for fabricating a semiconductor structure provided in a first embodiment of the present disclosure.
Figure 4:
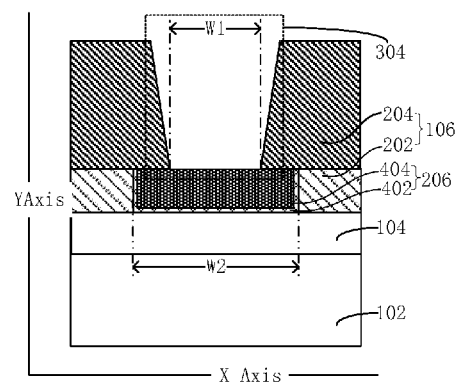
FIG. 4 is a schematic cross-sectional view of a semiconductor structure after a second contact hole is formed in the method for fabricating a semiconductor structure provided by an embodiment of the present disclosure corresponding to FIG. 3.

Specifically, FIG. 3 is a schematic cross-sectional view of a semiconductor structure after forming the first contact hole 302 in the method for fabricating a semiconductor structure provided in a first embodiment of the present disclosure, and FIG. 4 is an embodiment corresponding to FIG. 3. A schematic cross-sectional view of a semiconductor structure after the second contact hole 304 is formed in the provided method for preparing a semiconductor structure. Referring to FIG. 3 and FIG. 4, a first insulating layer 202 is formed on the upper surface of the first conductive structure 104 by a vapor deposition process, an atomic layer deposition process, etc., and further, the material of the first insulating layer 202 includes at least one of the materials such as silicon oxide material, silicon nitride material, silicon oxynitride; secondly, the first insulating layer 202 is patterned by a photolithography and etching process to form a first contact hole 302 penetrating the first insulating layer 202, and the bottom of the first contact hole 302 is exposed The first conductive structure 104, and the depth D1 of the first contact hole 302 is not greater than the distance T1 between the upper surface of the first insulating layer 202 and the lower surface of the second conductive structure 104, exemplarily, the bottom of the first contact hole 302 is exposed the upper surface of the first conductive structure 104, and further, the first contact hole 302 is formed by a dry etching process and/or a wet etching process; again, the first contact hole 302 is filled to form a first contact layer 206, and further, after forming a first contact material layer with an upper surface higher than the upper surface of the first insulating layer 202 in the first contact hole 302, removing the excess first contact material layer through a chemical grinding process, to obtain the remaining first contact material layer. The first contact layer 206 is formed of a contact material layer, and the upper surface of the first contact layer 206 is flush with the upper surface of the first insulating layer 202.

Further, the thermal expansion coefficient of the first contact layer 206 is not greater than the thermal expansion coefficient of the first conductive structure 104. During the operation of the semiconductor structure, the temperature of the device will rise. By setting the thermal expansion coefficient of the first contact 206 layer to be not greater than the thermal expansion coefficient of the first conductive structure 104, it avoids the mismatch of the thermal expansion coefficient causing cracks to appear and extend in the first conductive structure 104.

Figure 5:
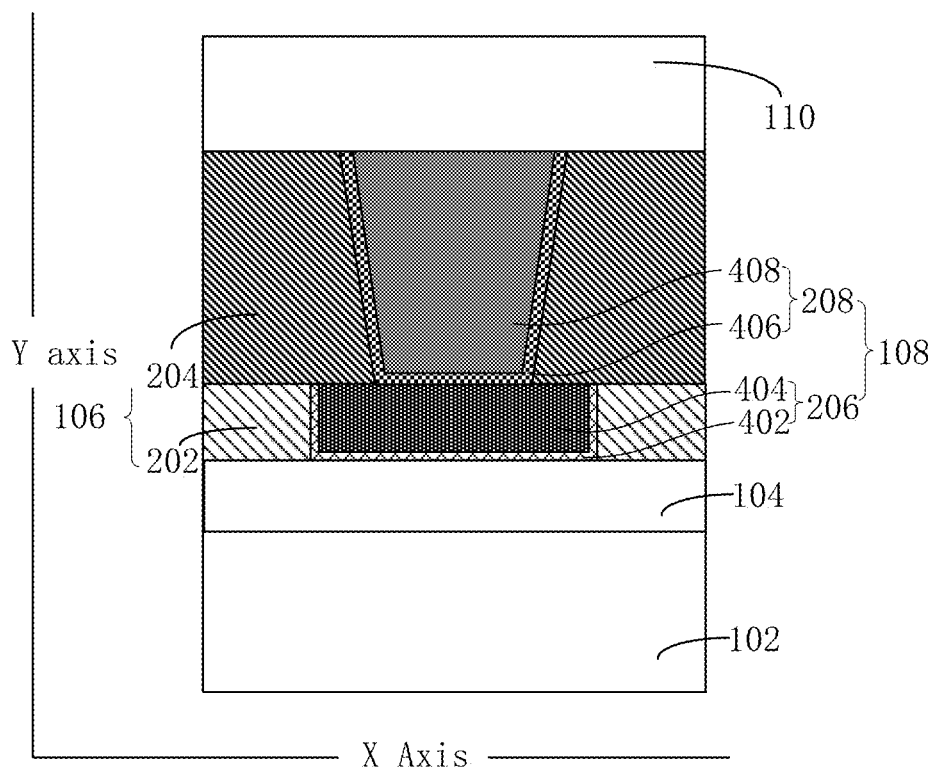
FIG. 5 is a schematic cross-sectional view of a semiconductor structure after a second contact layer is formed in the method for fabricating a semiconductor structure provided by an embodiment of the present disclosure corresponding to FIG. 4.

FIG. 5 is one of the schematic cross-sectional views of a semiconductor structure after the second contact layer 208 is formed in the method for fabricating a semiconductor structure provided in an embodiment corresponding to FIG. 4 in an embodiment of the present disclosure. Referring to FIGS. 4 and 5, first, a second insulating layer 204 is formed on the upper surface of the first insulating layer 202, and the second insulating layer 204 covers the upper surface of the first contact layer 206 at the same time, wherein the first insulating layer 202 and the second insulating layer 204 can work together to form the insulating layer 106. Further, the material of the second insulating layer 204 includes at least one of silicon oxide material, silicon nitride material, and silicon oxynitride material; further, the material of the second insulating layer 204 and the first insulating layer 202 are the same, for example they are silicon oxide materials. Next, a second contact hole 304 exposing the first contact layer 206 is formed in the second insulating layer 204 by a photolithography process, and the width W1 of the bottom of the second contact hole 304 along the X-axis direction is smaller than the width W2 of the first contact layer 206 along the X-axis direction (wherein the X-axis is perpendicular to the extension direction of the contact structure, and the Y-axis is parallel to the connection direction of the first part and the second part), at this time, a schematic cross-sectional view of the semiconductor structure is shown in FIG. 4. Further, the second contact hole 304 exposes the upper surface of the first contact layer 206, and the second contact hole 304 may be formed by a dry etching process and/or a wet etching process. Thirdly, the second contact layer 208 is formed by filling the second contact hole 304. At this time, the second contact layer 208 can be formed in the same manner as the first contact layer 206, which is not repeated here. The upper surface of the contact layer 208 is flush with the upper surface of the second insulating layer 204. At this time, a schematic cross-sectional view of the semiconductor structure is shown in FIG. 4.

Continuing to refer to FIG. 5, further, the first contact layer 206 includes a first barrier layer 402 and a first conductive layer 404, and the step of filling the first contact hole 302 to form the first contact layer 206 includes: filling the first contact hole 302 to form the first contact layer 206. The first barrier layer 402 is formed in the middle of the process, and the first barrier layer 402 covers the sidewall and bottom of the first contact hole 302. In practical applications, the first barrier layer 402 of different materials can be selected according to the process requirements, for example, the first barrier layer 402 The layer 402 is a titanium nitride barrier layer, a titanium barrier layer, etc.; then, a first conductive layer 404 is formed on the surface of the first barrier layer 402 away from the first insulating layer 202 and away from the first conductive structure 104, and the first conductive layer 404 is formed. The layer 404 fills the first contact hole 302. In practical applications, the first barrier layer 402 of different materials can be selected according to process requirements. For example, the first conductive layer 404 is a tungsten conductive layer, a copper conductive layer, an aluminum conductive layer, etc. The diffusion of conductive particles in the first conductive layer 404 can be blocked by disposing the first barrier layer 402.

Continuing to refer to FIG. 5, further, the second contact layer 208 includes a second barrier layer 406 and a second conductive layer 408, and the step of filling the second contact hole 304 to form the second contact layer 208 includes: filling the second contact hole 304 to form the second contact layer 208. The second barrier layer 406 is formed in the middle of the second contact hole 304, and the second barrier layer 406 covers the sidewall and bottom of the second contact hole 304. In practical applications, the second barrier layer 406 of different materials can be selected according to the process requirements, for example, the second barrier layer 406 can be a titanium nitride barrier layer, a titanium barrier layer, etc.; then, a second conductive layer 408 is formed on the surface of the second barrier layer 406 away from the second insulating layer 204 and away from the first contact layer 206, the second conductive layer 408 fills the second contact hole 304. In practical applications, the second barrier layer 406 of different materials can be selected according to process requirements. For example, the second conductive layer 408 is a tungsten conductive layer, a copper conductive layer, an aluminum conductive layer, etc. The diffusion of conductive particles in the first conductive layer 404 can be blocked by disposing the second barrier layer 406. Further, the second barrier layer 406 and the first barrier layer 402 are made of the same material, and/or the second conductive layer 408 and the first conductive layer are made of the same material.

As an example, the first conductive structure 104, the first contact layer 206, and the second contact layer 208 are all first material layers, and the first material layers at least include a tungsten material layer, a tungsten silicon material layer, a tungsten nitride material layer, and a nitride material layer. One of the tungsten silicon material layers.

Continuing to refer to FIG. 5, as an example, the method for fabricating the semiconductor structure further includes:

A metal wiring layer 110 is formed on the insulating layer 106, and the metal wiring layer 110 is in contact with the top of the contact structure 108, that is, the metal wiring layer 110 is in contact with the top of the second contact layer 208. The capacitor array under the electrode covering layer 102 is drawn out to the surface of the device, so that the capacitor array can be connected to the required position.

Further, the metal wiring layer 110 includes a metal ion blocking layer and a metal connecting layer, and the step of forming the metal wiring layer 110 on the insulating layer 106 includes: forming a metal ion blocking layer on the upper surface of the insulating layer 106, by disposing the metal ions barrier layer, to prevent the metal ions in the metal wiring layer 110 from diffusing into the insulating layer 106; a metal connection layer is formed on the upper surface of the metal ion barrier layer and the second contact layer 208, and the metal connection layer is connected to the top surface of second contact layer 208.

Figure 6:
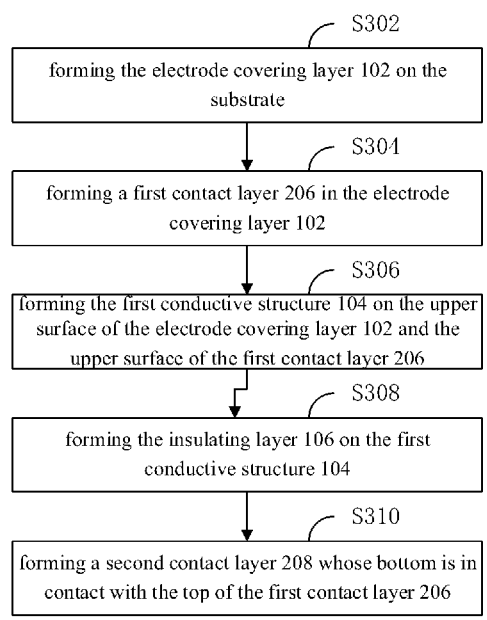
FIG. 6 is a schematic flowchart of the method for fabricating a semiconductor structure according to a second embodiment of the present disclosure.

FIG. 6 is a schematic flowchart of a method for fabricating a semiconductor structure according to a second embodiment of the present disclosure. Referring to FIG. 6, in the embodiment of the present disclosure, the method for fabricating a semiconductor structure includes:

S302, forming the electrode covering layer 102 on the substrate;

S304, forming a first contact layer 206 in the electrode covering layer 102;

wherein, a first contact layer 206 whose lower surface is not lower than the lower surface of the electrode covering layer 102 is formed in the electrode covering layer 102 through a preparation process;

S306, forming the first conductive structure 104 on the upper surface of the electrode covering layer 102 and the upper surface of the first contact layer 206;

S308, forming the insulating layer 106 on the first conductive structure 104; and S310, forming a second contact layer 208 whose bottom is in contact with the top of the first contact layer 206 in the insulating layer 106 and the first conductive structure 104.

The contact structure 108 includes a first contact layer 206 and a second contact layer 208, the width of the first contact layer 206 is greater than the width of the bottom of the second contact layer 208; the lower surface of the contact structure 108 is not lower than the lower surface of the electrode covering layer 102, the resistivity of the first conductive structure 104 is not greater than the resistivity of the contact structure 108 and is not greater than the resistivity of the electrode covering layer 102.

The method for fabricating a semiconductor structure according to an embodiment of the present disclosure includes forming a first contact layer 206 in the electrode covering layer 102; forming a first conductive structure 104 on the upper surface of the electrode covering layer 102 and the upper surface of the first contact layer 206; forming an insulating layer 106 on the first conductive structure 104; forming a second contact layer 208 in the insulating layer 106 and the first conductive structure 104, wherein the bottom of the second contact layer 208 is in contact with the top of the first contact layer 206; wherein, wherein the contact structure 108 includes a first contact layer 206 and a second contact layer 208, the first contact layer 206 is in contact with the first conductive structure 104, the bottom of the second contact layer 208 is in contact with the top of the first contact layer 206; the width of the first contact layer 206 is greater than the width of the bottom of the second contact layer 208; wherein the lower surface of the contact structure 108 is not lower than the lower surface of the electrode covering layer 102, wherein the resistivity of the first conductive structure 104 is not greater than that of the contact structure 108, and is not greater than the resistivity of the electrode covering layer 102. Compared with the first embodiment, the contact area between the contact structure 108 and the electrode cover layer 102 is increased, and process redundancy is provided for the etching process for forming the second contact layer 208, and the etching process for forming the second contact layer 208 is avoided. Etching into the electrode capping layer 102 reduces the bulk resistance between the contact structure 108 and the capacitive structure under the electrode capping layer 102. In addition, the first contact layer 206 in contact with the first conductive structure 104 plays a supporting role during the chemical mechanical polishing process, so as to avoid the load effect or the concave problem of the contact structure 108.

Figure 7:
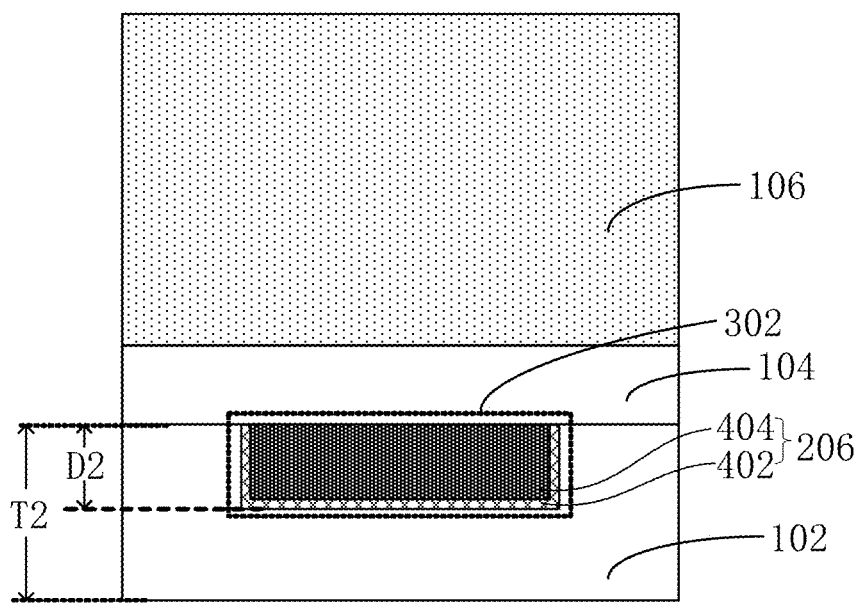
FIG. 7 is a schematic cross-sectional view of a semiconductor structure after an insulating layer is formed in the method for fabricating the semiconductor structure provided in a second embodiment of the present disclosure.
Figure 8:
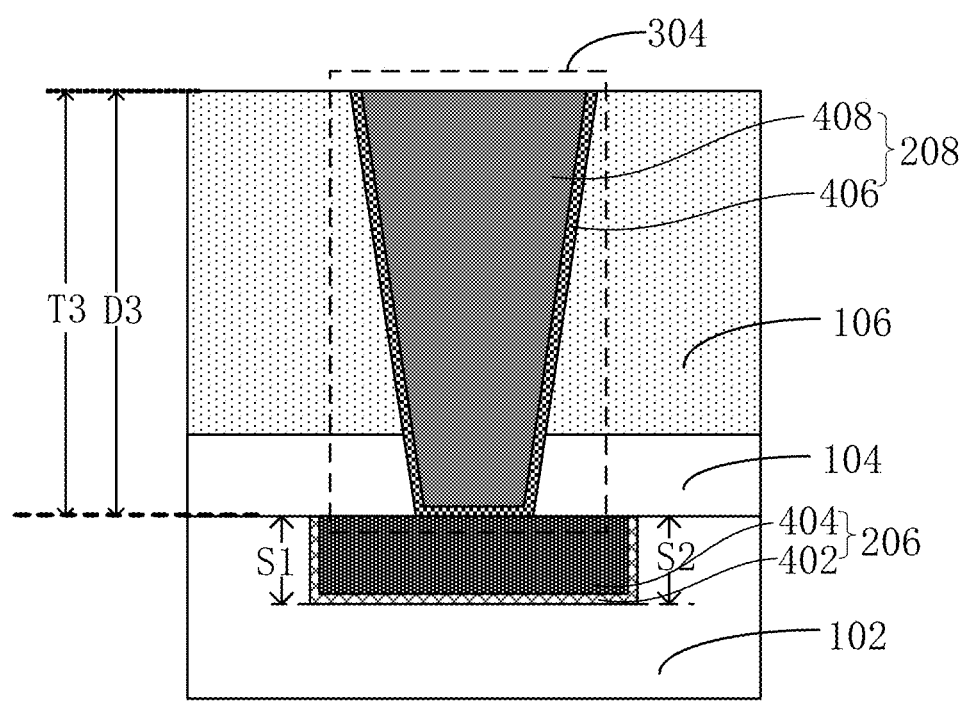
FIG. 8 is a schematic cross-sectional view of a semiconductor structure after a second contact layer is formed in the method for fabricating the semiconductor structure provided by an embodiment of the present disclosure corresponding to FIG. 7.

FIG. 7 is a schematic cross-sectional view of a semiconductor structure after the insulating layer 106 is formed with the method for fabricating the semiconductor structure provided in the second embodiment of the present disclosure; FIG. 8 provides a schematic cross-sectional view of a semiconductor structure after the second contact layer 208 is formed in the preparation method of the semiconductor structure according to an embodiment corresponding to FIG. 7. The first contact hole 302 is formed in the electrode cover layer 102 by etching process, the depth D2 of the first contact hole 302 is not greater than the thickness T2 of the electrode cover layer 102, and then the first contact hole 302 is filled to form the first contact layer 206, and further, the first contact layer 206 is flush with the upper surface of the electrode covering layer 102. Furthermore, the first contact layer 206 includes a first barrier layer 402 covering the bottom and sidewalls of the first contact hole 302 and a first conductive layer 404 filling the first contact hole 302, the first barrier layer 402 and the first barrier layer 402. For the definition of the conductive layer 404, reference may be made to the first embodiment of the present disclosure, and details are not described herein. In the second step, first, a first conductive structure 104 is formed on the upper surface of the electrode covering layer 102 by using a deposition process, and the first conductive structure 104 extends along the upper surface of the electrode covering layer 102 to cover the first upper surface of the contact layer 206. Then, an insulating layer 106 is formed on the upper surface of the first conductive structure 104, and the material of the insulating layer 106 includes at least one of a silicon oxide material, a silicon nitride material, and a silicon oxynitride material. In the third step, a second contact hole 304 is formed in the insulating layer 106 through a photolithography process. Referring to FIG. 8, further, the second contact hole 304 penetrates through the first conductive structure 104 to expose the upper part of the first contact layer 206 At this time, the depth D3 of the second contact hole 304 is equal to the distance T3 between the upper surface of the insulating layer 106 and the lower surface of the first conductive structure 104. Then, the second contact hole 304 is filled to form a second contact layer 208 whose bottom is in contact with the top of the first contact layer 206. Further, the second contact layer 208 includes a second barrier layer 406 covering the bottom and sidewalls of the second contact hole 304 and a second conductive layer 408 filling the second contact hole 304. For the disclosure of the second barrier layer 406 and the second conductive layer 408, reference can be made to the first embodiment of present disclosure, and their details are not described here.

Compared with the first embodiment of the present disclosure, the contact area between the contact structure 108 and the electrode cover layer 102 in the second embodiment of the present disclosure is increased by the sidewall contact portion of the first contact layer 206 (as shown in FIG. 8), the contact resistance between the contact structure 108 and the electrode cover layer 102 is reduced, and the adhesion between the contact structure 108 and the electrode cover layer 102 is increased.

Further, the first conductive structure 104 and the first contact layer 206 are made of the same material. At this time, the second contact hole 304 penetrates through the insulating layer 106 to expose the first conductive structure 104. The depth D3 of the second contact hole 304 is greater than or equal to the thickness of the insulating layer 106 and less than or equal to the distance T3 between the upper surface of the insulating layer 106 and the lower surface of the first conductive structure 104, for example, the depth D3 of the second contact hole 304 is equal to the thickness of the insulating layer 106. By connecting the second contact layer 208 to the top of the first contact layer 206 via the first conductive structure 104, that is, the first conductive structure 104 is equivalent to a part of the first contact layer 206, it can be regarded as the second contact layer 208 is in contact with the top of the first contact layer 206. The adhesion between the contact structure 108 and the first conductive structure 104 and between the first contact layer 206 and the second contact layer 208 is increased. The etching depth of the second contact hole is reduced to avoid the problem of voids in the contact structure 108 in the subsequent filling process.

As an example, the thermal expansion coefficient of the first contact layer 206 is not greater than the thermal expansion coefficient of the electrode cover layer 102.

During the operation of the semiconductor structure, the temperature of the device will rise. By setting the thermal expansion coefficient of the first contact layer 206 to be no greater than the thermal expansion coefficient of the electrode cover layer 102, the abnormality of cracks and extension in the electrode cover layer 102 caused by the mismatch of the thermal expansion coefficients is avoided.

Further, the thermal expansion coefficient of the second contact layer 208 is not greater than the thermal expansion coefficient of the first conductive structure 104. During the operation of the semiconductor structure, the temperature of the device will rise. By setting the thermal expansion coefficient of the second contact layer 208 to be no greater than the thermal expansion coefficient of the first conductive structure 104, it is avoided that the mismatch of the thermal expansion coefficients causes cracks to appear and extend in the first conductive structure 104.

As an example, the resistivity of the first conductive structure 104 is smaller than the resistivity of the electrode cover layer 102, for example, the doping concentration of the first conductive structure 104 is greater than the doping concentration of the electrode cover layer 102, the contact structure 108 and the contact structure 108 can be reduced by this setting. The resistivity of the contact resistance between the electrode covering layers 102 reduces the resistance value of the contact resistance.

As an example, the resistivity of the first conductive structure 104 is smaller than the resistivity of the first contact layer 206, for example, the doping concentration of the first conductive structure 104 is not less than the doping concentration of the first contact layer 206, which can also be reduced by this setting. The resistivity of the contact resistance between the contact structure 108 and the electrode covering layer 102 reduces the resistance value of the contact resistance.

Figure 9:
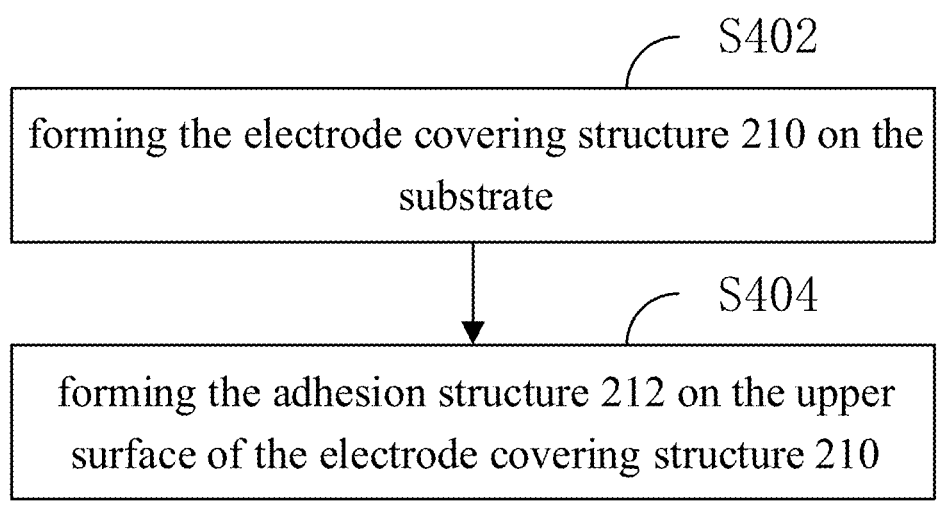
FIG. 9 is a schematic flowchart of forming an electrode cover layer on a substrate according to an embodiment of the present disclosure.

FIG. 9 is a schematic flowchart of forming an electrode covering layer 102 on a substrate according to an embodiment of the present disclosure. Referring to FIG. 9, in the embodiment of the present disclosure, the electrode covering layer 102 includes: electrode covering structures 210 stacked sequentially from the substrate. and the adhesion structure 212, the steps of forming the electrode cover layer 102 on the substrate include:

S402, forming the electrode covering structure 210 on the substrate; and

S404, forming the adhesion structure 212 on the upper surface of the electrode covering structure 210.

In the embodiment of the present disclosure, the adhesion between the electrode covering structure 210 and the first conductive structure 104 is increased by providing the adhesion structure 212.

As an example, the material of the electrode covering structure 210 includes at least one of boron-doped polysilicon material and boron-doped silicon germanium material. Further, the material of the electrode covering structure 210 is a boron-doped silicon germanium material.

As an example, the material of the adhesion structure 212 includes at least one of boron-doped silicon material, boron-doped amorphous silicon material, boron-doped polysilicon material, tungsten nitride material, tungsten silicide material, and tungsten silicon nitride material. Further, the material of the adhesion structure 212 is boron-doped polysilicon material.

As an example, the coefficient of thermal expansion of the first contact layer 206 is no greater than the coefficient of thermal expansion of the adhesion structure 212. During the working process of the semiconductor structure, the temperature of the device will increase. By setting the thermal expansion coefficient of the first contact layer 206 to be no greater than the thermal expansion coefficient of the adhesive structure 212, the abnormality of cracks and extension in the adhesive structure 212 caused by the mismatch of the thermal expansion coefficients is avoided.

Figure 10:
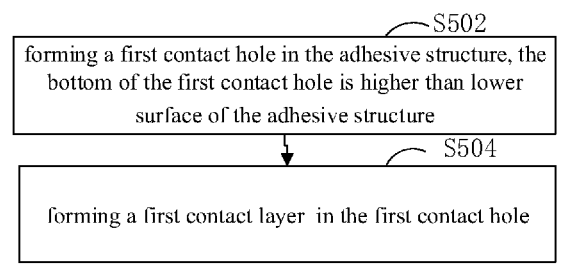
FIG. 10 is a schematic flow chart of forming a first contact layer in an electrode cover layer in the method for fabricating the semiconductor structure provided by an embodiment of the present disclosure.

FIG. 10 is a schematic flow chart of forming the first contact layer 206 in the electrode covering layer 102 in the method for fabricating the semiconductor structure provided by the embodiment of the present disclosure. In the embodiment of the present disclosure, the first contact layer 206 is formed in the electrode covering layer 102 The steps of the first contact layer 206 include:

S502, forming a first contact hole 302 in the adhesive structure 212, and the bottom of the first contact hole 302 is higher than the lower surface of the adhesive structure 212; and S504, forming a first contact layer 206 in the first contact hole 302.

Figure 11:
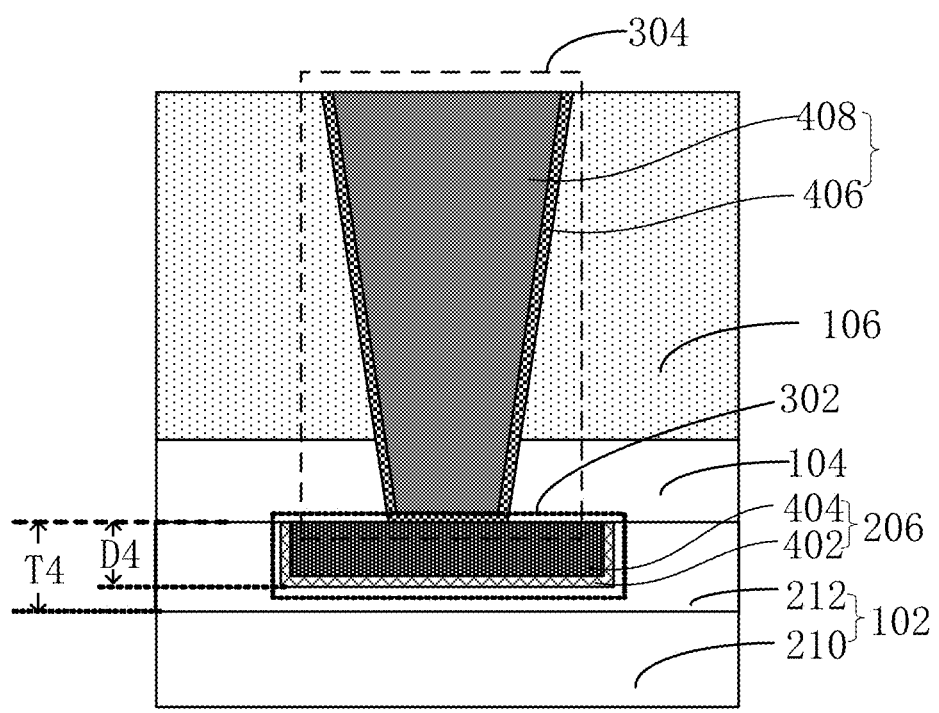
FIG. 11 is a schematic cross-sectional view of a semiconductor structure after forming a second contact layer in the method for fabricating a semiconductor structure provided by an embodiment of the present disclosure corresponding to FIG. 10.

FIG. 11 is a schematic cross-sectional view of a semiconductor structure after the second contact layer 208 is formed in the method for fabricating a semiconductor structure provided in a disclosed embodiment corresponding to FIG. 10 in the disclosed embodiment. Specifically, first, the first contact hole 302 is formed in the adhesion structure 212 by a photolithography etching process, and the depth D4 of the first contact hole 302 is smaller than the thickness T4 of the adhesion structure 212. Second, the first contact layer 206 is formed in the first contact hole 302, for example, the upper surface of the first contact layer 206 is flush with the upper surface of the adhesive structure 212. For the description of the first contact layer 206 in this embodiment of the present disclosure, reference may be made to the disclosed embodiment corresponding to FIG. 8, which will not be repeated here. Third, the first conductive structure 104 and the insulating layer 106 are sequentially formed on the electrode covering structure 210, and the second contact layer 208 is formed on the insulating layer 106 and the first conductive structure 104, and the second contact layer 208 penetrates the insulating layer 106 to be in contact with the top of the first contact layer 206; for the description of the second contact layer 208 in this embodiment of the present disclosure, refer to the disclosed embodiment corresponding to FIG. 8, which will not be repeated here. By disposing the adhesion structure 212, the adhesion between the first conductive structure 104 and the electrode cover layer 102 is increased, the contact area between the contact structure 108 and the electrode cover layer 102 is increased, and the contact resistance is reduced. resistance.

As an example, the resistivity of the first conductive structure 104 is not greater than the resistivity of the first contact layer 206, for example, the doping concentration of the first conductive structure 104 is not less than the doping concentration of the first contact layer 206, at this time, the contact portion between the first conductive structure 104 and the adhesion structure 212 is equivalent to a portion of the contact area between the contact structure 108 and the electrode covering layer 102, which further reduces the resistance value of the contact resistance.

Further, the resistivity of the adhesion structure 212 is not greater than the resistivity of the electrode covering structure 210, for example, the doping concentration of the adhesion structure 212 is not less than the doping concentration of the electrode covering structure 210, and the resistivity of the first conductive structure 104 is not smaller than the resistivity of the adhesion structure 212, for example, the doping concentration of the first conductive structure 104 is not greater than the doping concentration of the adhesion structure 212. At this time, the contact area between the contact structure 108 and the electrode cover layer 102 is equivalent to the contact area between the adhesive structure 212 and the electrode covering structure 210, thus reducing the resistance of the contact resistance.

Further, the resistivity of the adhesion structure 212 is not greater than the resistivity of the electrode covering structure 210, for example, the doping concentration of the adhesion structure 212 is not less than the doping concentration of the electrode covering structure 210, and the resistivity of the first conductive structure 104 is less than The resistivity of the adhesion structure 212, for example, the doping concentration of the first conductive structure 104 is greater than the doping concentration of the adhesion structure 212, at this time, the contact area between the contact structure 108 and the electrode cover layer 102 is equivalent to the contact area between the first conductive structure 104 and the adhesive structure 212 and the contact area between the contact structure 108 (the first contact layer 206) and the electrode covering structure 210, at the time that the volume resistance of the contact structure 108 is reduced, and the contact resistance is also reduced.

Figure 12:
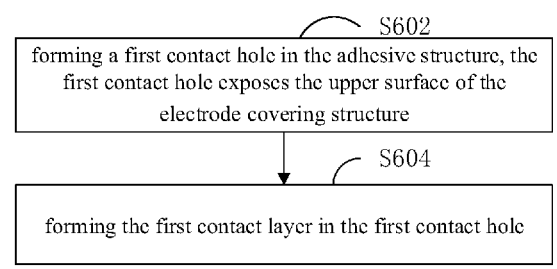
FIG. 12 is another schematic flow chart of forming a first contact layer in an electrode cover layer in the method for fabricating the semiconductor structure according to an embodiment of the present disclosure.

FIG. 12 is another schematic flowchart of forming the first contact layer 206 in the electrode covering layer 102 in the method for fabricating a semiconductor structure provided by another disclosed embodiment. The steps of a contact layer 206 include:

S602, forming a first contact hole 302 in the adhesive structure 212, and the first contact hole 302 exposes the upper surface of the electrode covering structure 210; and S604, forming the first contact layer 206 in the first contact hole 302.

Figure 13:
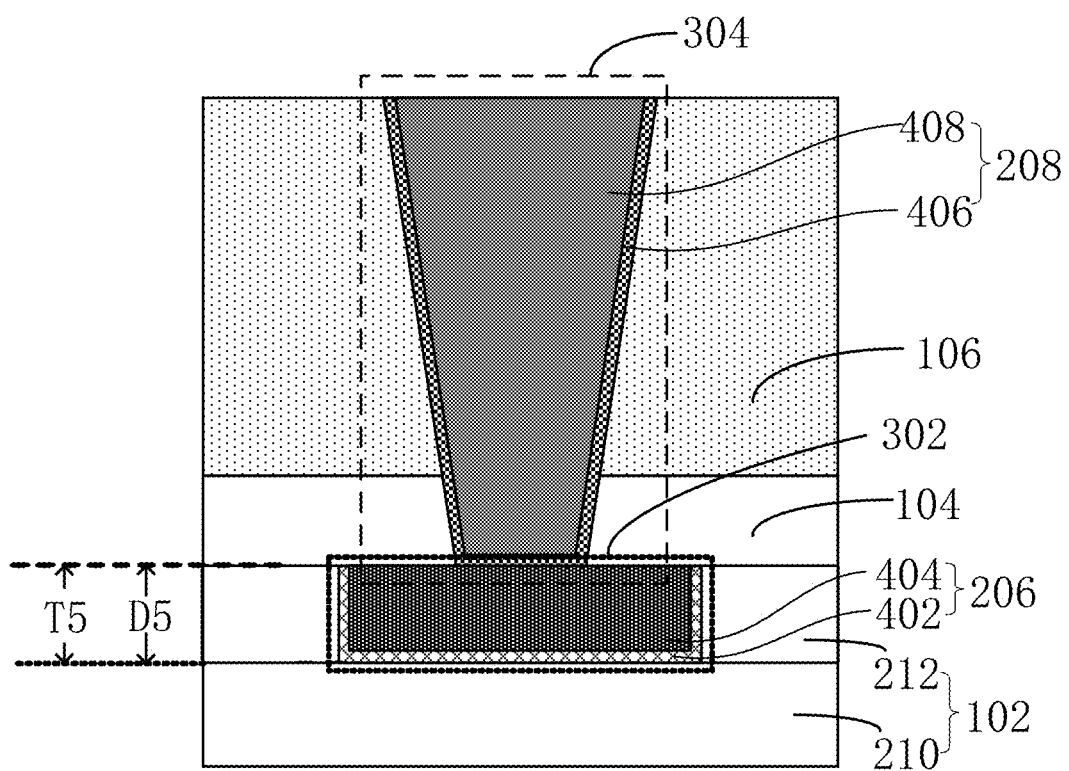
FIG. 13 is a schematic cross-sectional view of another semiconductor structure after forming a second contact layer in the method for fabricating a semiconductor structure provided by an embodiment of the present disclosure corresponding to FIG. 12.

FIG. 13 is a schematic cross-sectional view of another semiconductor structure after the second contact layer 208 is formed in the method for fabricating the semiconductor structure provided by a disclosed embodiment corresponding to FIG. 12. Specifically, first, a photolithography method well known to those skilled in the art is used. In the etching process, the first contact hole 302 is formed in the adhesion structure 212, and the depth D5 of the first contact hole 302 is equal to the thickness T5 of the adhesion structure 212, that is, the first contact hole 302 exposes the upper surface of the electrode covering structure 210. Second, the first contact layer 206 is formed in the first contact hole 302, for example, the upper surface of the first contact layer 206 is flush with the upper surface of the adhesive structure 212. The description about the first contact layer 206 in the embodiment of the present disclosure also refers to the disclosed embodiment corresponding to FIG. 8, which is not repeated here. Third, the first conductive structure 104 and the insulating layer 106 are sequentially formed on the electrode covering structure 210, and the second contact layer 208 is formed on the insulating layer 106 and the first conductive structure 104, and the second contact layer 208 penetrates the insulating layer 106 to contact with the top of the first contact layer 206; the description of the second contact layer 208 in this embodiment of the present disclosure should refer to the disclosed embodiment corresponding to FIG. 8, which is not repeated here. By disposing the adhesion structure 212, the adhesion between the first conductive structure 104 and the electrode cover layer 102 is increased, the contact area between the contact structure 108 and the electrode cover layer 102 is increased, and the contact resistance is reduced. resistance.

Further, the resistivity of the first conductive structure 104 is not greater than the resistivity of the first contact layer 206, for example, the doping concentration of the first conductive structure 104 is not less than the doping concentration of the first contact layer 206, and the resistance of the adhesion structure 212 is not greater than the resistivity of the electrode covering structure 210. For example, the doping concentration of the adhesion structure 212 is not less than the doping concentration of the electrode covering structure 210. At this time, the contact portion between the first conductive structure 104 and the first adhesion structure 212, the contact portion between the contact layer 206 and the first adhesive structure 212, and the contact portion between the first contact layer 206 and the electrode cover layer 102 together constitute the contact area between the contact structure 108 and the electrode cover layer 102, which further reduces the resistance of the contact resistance.

Further, the resistivity of the first conductive structure 104 is smaller than the resistivity of the adhesion structure 212, for example, the doping concentration of the first conductive structure 104 is greater than the doping concentration of the adhesion structure 212, which further reduces the contact structure. 108 bulk resistance.

Figure 14:
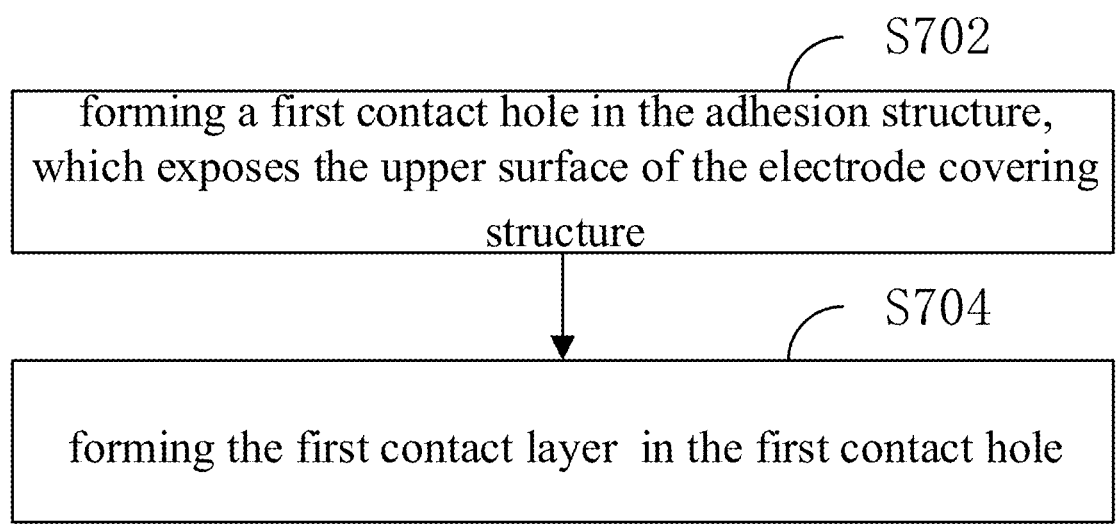
FIG. 14 is another schematic flow chart of forming a first contact layer in an electrode cover layer in the method for fabricating a semiconductor structure according to an embodiment of the present disclosure.

FIG. 14 is another schematic flow chart of forming the first contact layer 206 in the electrode covering layer 102 in the method for fabricating a semiconductor structure provided by another disclosed embodiment. In the disclosed embodiment, the steps of forming the first contact layer 206 in the electrode covering layer 102 include:

S702, forming a first contact hole 302 in the adhesion structure 212 and the electrode covering structure 210, the first contact hole 302 passing through the adhesion structure 212 and extending into the electrode covering layer 102; and S704, forming the first contact layer 206 in the first contact hole 302.

Figure 15:
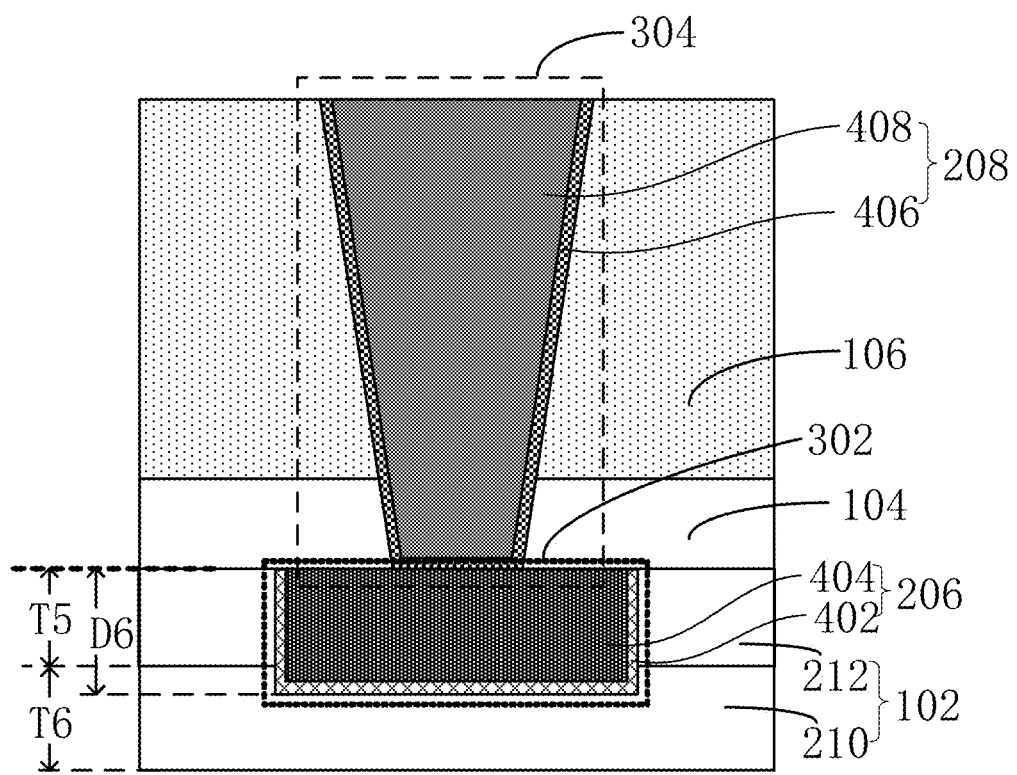
FIG. 15 is a schematic cross-sectional view of another semiconductor structure after forming a second contact layer in the method for fabricating the semiconductor structure provided by an embodiment of the present disclosure corresponding to FIG. 14.

FIG. 15 is a schematic cross-sectional view of another semiconductor structure after the second contact layer 208 is formed in the method for fabricating the semiconductor structure provided by the disclosed embodiment corresponding to FIG. 14. In the etching process, a first contact hole 302 is formed in the adhesion structure 212, the first contact hole 302 penetrates through the adhesion structure 212 and extends into the electrode covering structure 210, and the depth D6 of the first contact hole 302 is greater than the thickness T5 of the adhesion structure 212, and is smaller than the sum of the thickness T5 of the adhesion structure 212 and the thickness T6 of the electrode covering structure 210, that is, the bottom of the first contact hole 302 stays inside the electrode covering structure 210. Second, the first contact layer 206 is formed in the first contact hole 302, for example, the upper surface of the first contact layer 206 is flush with the upper surface of the adhesive structure 212. The description about the first contact layer 206 in the embodiment of the present disclosure also refers to the disclosed embodiment corresponding to FIG. 8, which is not repeated here. Third, the first conductive structure 104 and the insulating layer 106 are sequentially formed on the electrode covering structure 210, and the second contact layer 208 is formed on the insulating layer 106 and the first conductive structure 104, and the second contact layer 208 penetrates the insulating layer 106 It is in contact with the top of the first contact layer 206; the description of the second contact layer 208 in this embodiment of the present disclosure also refers to the disclosed embodiment corresponding to FIG. 8, which is not repeated here. By disposing the adhesion structure 212, the adhesion between the first conductive structure 104 and the electrode cover layer 102 is increased, the contact area between the contact structure 108 and the electrode cover layer 102 is increased, and the contact resistance is reduced. resistance.

Further, the resistivity of the first conductive structure 104 is not greater than the resistivity of the first contact layer 206, for example, the doping concentration of the first conductive structure 104 is not less than the doping concentration of the first contact layer 206. The contact portion between the structure 104 and the adhesive structure 212, the contact portion between the first contact layer 206 and the adhesive structure 212, and the contact portion between the first contact layer 206 and the electrode cover layer 102 together constitute the space between the contact structure 108 and the electrode cover layer 102. The contact area further reduces the resistance value of the contact resistance, and reduces the bulk resistance of the contact structure 108 at the same time. Further, the resistivity of the adhesion structure 212 is not greater than that of the electrode covering structure 210, and the resistivity of the adhesion structure 212 is smaller than that of the first conductive structure 104. At this time, the contact part of the adhesion structure 212 and the electrode covering structure. 210 and the contact part of the first contact layer 206 and the electrode cover layer 102 together constitute the contact area between the contact structure 108 and the electrode cover layer 102, which further increases the contact area and reduces the resistance value of the contact resistance and the volume resistance of the contact structure 108.

As an example, the thermal expansion coefficient of the first contact layer 206 is not greater than the thermal expansion coefficient of the first conductive structure 104, and the temperature of the device will increase during the operation of the semiconductor structure. By setting the thermal expansion coefficient of the first contact layer 206 to be no greater than the first conductive structure The thermal expansion coefficient of 104 avoids the abnormality of cracks and extension of the contact surface between the first contact layer 206 and the first conductive structure 104 caused by the mismatch of the thermal expansion coefficient.

Further, the thermal expansion coefficient of the first contact layer 206 is not greater than the thermal expansion coefficient of the adhesion structure 212, and the thermal expansion coefficient of the first contact layer 206 is not greater than the thermal expansion coefficient of the electrode cover layer 102. By this setting, the thermal expansion coefficient mismatch is avoided. As a result, an abnormality of cracks and extension will not occur between the first contact layer 206 and the adhesion structure 212 and/or between the first contact layer 206 and the electrode covering layer 102.

It should be understood that although the various steps in the flowchart of FIG. 1 are shown in sequence according to the arrows, these steps are not necessarily executed in the sequence shown by the arrows. Unless explicitly stated herein, the execution of these steps is not strictly limited to the order, and these steps may be performed in other orders. Moreover, at least some of the steps in FIG. 1 may include multiple steps or multiple stages, these steps or stages are not necessarily executed at the same time, but may be executed at different times, and the execution sequence of these steps or stages does not have to be performed sequentially, but may be performed alternately or alternately with other steps or at least a portion of the steps or stages within the other steps. It can be understood that, in the above disclosed embodiments, the first contact hole 302 refers to the opening filled by the first contact layer 206, the second contact hole 304 refers to the opening filled by the second contact layer 208, and the first contact hole 302. The positions of the second contact holes 304 in the cross-sectional views of the semiconductor structures corresponding to the disclosed embodiments may be the same or different.

Referring to FIG. 5, an embodiment of the present disclosure further provides a semiconductor structure including: an electrode capping layer 102, a first conductive structure 104 and a contact structure 108. The electrode cover layer 102 is located on the substrate (not shown in the FIG. 5). Exemplarily, the material of the electrode cover layer 102 includes at least one of boron-doped polysilicon material and boron-doped silicon germanium material; the first conductive structure 104 is located on the upper surface of the electrode covering layer 102, exemplarily, the first conductive structure 104 includes at least one of a tungsten conductive structure, a tungsten nitride conductive structure, a tungsten silicide conductive structure, and a tungsten silicon nitride conductive structure; the contact structure 108, 108 includes the first conductive structure. A contact layer 206 and a second contact layer 208, the first contact layer 206 is in contact with the first conductive structure 104, the bottom of the second contact layer 208 is in contact with the top of the first contact layer 206; the width of the first contact layer 206 W2 (length along the X-axis direction) is greater than the width W1 (length along the X-axis direction) of the bottom of the second contact layer 208; wherein, the lower surface of the contact structure 108 is not lower than the lower surface of the electrode covering layer 102, the resistivity of the first conductive structure 104 is not greater than the resistivity of the contact structure 108 and is not greater than the resistivity of the electrode capping layer 102.

The semiconductor structure of the embodiment of the present disclosure includes an electrode cover layer 102 on the substrate, a first conductive structure 104 located on the upper surface of the electrode cover layer 102; the contact structure 108 including the first contact layer 206 and the second contact layer 208, the first A contact layer 206 is in contact with the first conductive structure 104, the bottom of the second contact layer 208 is in contact with the top of the first contact layer 206; the width of the first contact layer 206 is greater than the width of the bottom of the second contact layer 208, the contact structure The lower surface of 108 is not lower than the lower surface of the electrode covering layer 102, and the resistivity of the first conductive structure 104 is not greater than that of the contact structure 108 and the resistivity of the electrode covering layer 102. Compared with directly forming the contact structure 108 in contact with the electrode cover layer 102, the contact area between the contact structure 108 and the electrode cover layer 102 is increased, and the formation of voids in the contact structure 108 is avoided, thereby reducing the contact resistance. At the same time, the contact structure 108 is in contact with the electrode cover layer 102 through the first conductive structure 104 whose resistivity is not greater than that of the contact structure 108 and not greater than that of the electrode cover layer 102, thereby reducing the contact structure 108 and the electrode cover layer. The bulk resistance between the capacitive structures below 102, and the thickness of the contact structure 108 (distance between the lower surface and the upper surface of the contact structure). In addition, the first contact layer in contact with the first conductive structure plays a supporting role in the chemical mechanical polishing process, avoiding the problem of load effect or depression of the contact structure.

Continuing to refer to FIG. 5, as an example, the first contact layer 206 is located on the upper surface of the first conductive structure 104, and the thermal expansion coefficient of the first contact layer 206 is not greater than that of the first conductive structure 104. During the operation of the semiconductor structure, the temperature of the device will increase. By setting the thermal expansion coefficient of the first contact layer 206 to be no greater than the thermal expansion coefficient of the first conductive structure 104, it is avoided that the mismatch of the thermal expansion coefficient causes cracks and extension in the first conductive structure 104.

Continuing to refer to FIG. 5, as an example, the semiconductor structure further includes an insulating layer 106106, the insulating layer 106106 is located on the upper surface of the first conductive structure 104, and the material of the insulating layer 106 includes at least a silicon oxide material, a silicon nitride material, and a silicon oxynitride material. The first contact layer 206 includes a first conductive layer 404 and a first barrier layer 402, the first conductive layer 404 is located in the insulating layer 106, and the first barrier layer 402 is located between the first conductive layer 404 and the insulating layer 106 and between the first conductive layer 404 and the first conductive structure 104; in practical applications, the first barrier layer 402 and the first conductive layer 404 of different materials can be selected according to process requirements, for example, the first barrier layer 402 is a titanium nitride barrier layer, titanium barrier layer, etc., the first conductive layer 404 is a tungsten conductive layer, a copper conductive layer, an aluminum conductive layer, and the like. The diffusion of conductive particles in the first conductive layer 404 can be blocked by disposing the first barrier layer 402. Further, the second contact layer 208 includes a second conductive layer 408 and a second barrier layer 406, the second conductive layer 408 is located in the insulating layer 106, and the second barrier layer 406 is located between the second conductive layer 408 and the insulating layer 106 and Between the second conductive layer 408 and the first conductive layer 404, in practical applications, the second barrier layer 406 and the second conductive layer 408 of different materials can be selected according to process requirements. For example, the second barrier layer 406 is a titanium nitride barrier layer, a titanium barrier layer, etc., the second conductive layer 408 is a tungsten conductive layer, a copper conductive layer, an aluminum conductive layer, and the like. The diffusion of conductive particles in the second conductive layer 408 can be blocked by disposing the second barrier layer 406. Further, the second barrier layer 406 and the first barrier layer 402 are made of the same material, and/or the second conductive layer 408 and the first conductive layer are made of the same material.

As an example, the upper surface of the second contact layer 208 is flush with the upper surface of the second insulating layer 204.

Continuing to refer to FIG. 5, further, the insulating layer 106 includes a first insulating layer 202 on the upper surface of the first conductive structure 104 and a second insulating layer 204 on the upper surface of the first insulating layer 202, and the first contact layer 206 is on the first insulating layer 204. In the insulating layer 202, further, the upper surface of the first contact layer 206 is flush with the upper surface of the first insulating layer 202; the second contact layer 208 is located in the second insulating layer 204, and further, the second contact layer 208 The upper surface of the second insulating layer 204 is flush with the upper surface of the second insulating layer 204.

As an example, the material of the first insulating layer 202 and/or the second insulating layer 204 includes at least one of a silicon oxide material, a silicon nitride material, and a silicon oxynitride material, and further, the second insulating layer 204 and the first The insulating layer 202 is made of the same material, such as silicon oxide.

Continuing to refer to FIG. 5, as an example, the semiconductor structure further includes: a metal wiring layer 110, the metal wiring layer 110 is located on the contact structure 108 and is in contact with the top of the contact structure 108, and the electrode can be covered by the metal wiring layer 110 The capacitor array under layer 102 is drawn out to the surface of the device, facilitating connection of the capacitor array to the desired location.

Further, the metal wiring layer 110 includes: a metal ion blocking layer and a metal connecting layer, wherein the metal ion blocking layer is located on the upper surface of the insulating layer 106, and the metal ion blocking layer is provided to prevent the metal ions in the metal wiring layer 110 The purpose of diffusion of ions into the insulating layer 106; the metal connection layer is located on the upper surface of the metal ion blocking layer and the second contact layer 208, the metal connection layer is in contact with the top surface of the second contact layer 208.

7, as an example, the first contact layer 206 is located on the lower surface of the first conductive structure 104; the semiconductor structure further includes an insulating layer 106, and the insulating layer 106 is located on the upper surface of the first conductive structure 104;

The first contact layer 206 includes a first conductive layer 404 and a first barrier layer 402, the first conductive layer 404 is located in the electrode cover layer 102, and the first barrier layer 402 is located between the first conductive layer 404 and the electrode cover layer 102;

The second contact layer 208 includes a second conductive layer 408 and a second barrier layer 406, the second conductive layer 408 includes a portion located in the insulating layer 106 and a portion located in the first conductive structure 104, and the second barrier layer 406 is located in the second Between the conductive layer 408 and the insulating layer 106, between the second conductive layer 408 and the first conductive structure 104, and between the second conductive layer 408 and the first conductive layer 404. Compared with the disclosed embodiment corresponding to FIG. 4, the contact area between the contact structure 108 and the electrode cover layer 102 is increased, and process redundancy is provided for the etching process for forming the second contact layer 208 to avoid the formation of the second contact layer 208. The etching process etches the electrode capping layer 102 to reduce the bulk resistance between the contact structure 108 and the capacitor structure under the electrode capping layer 102.

Compared with the first embodiment of the present disclosure, the contact area between the contact structure 108 and the electrode cover layer 102 in the second embodiment of the present disclosure is increased by the sidewall contact portion of the first contact layer 206 (as shown in FIG. 8), the contact resistance between the contact structure 108 and the electrode cover layer 102 is reduced, and the adhesion between the contact structure 108 and the electrode cover layer 102 is increased.

Further, the first conductive structure 104 and the first contact layer 206 are made of the same material. At this time, the second contact hole 304 penetrates through the insulating layer 106 to expose the first conductive structure 104. The depth D3 of the second contact hole 304 is greater than or equal to the thickness of the insulating layer 106 and less than or equal to the distance T3 between the upper surface of the insulating layer 106 and the lower surface of the first conductive structure 104, for example, the depth D3 of the second contact hole 304 is equal to the thickness of the insulating layer 106, the second contact layer 208 By connecting the first conductive structure 104 to the top of the first contact layer 206, that is, the first conductive structure 104 is equivalent to a part of the first contact layer 206, it can be regarded as the second contact layer 208 is in contact with the top of the first contact layer 206. The adhesion between the contact structure 108 and the first conductive structure 104 and between the first contact layer 206 and the second contact layer 208 is increased. The etching depth of the second contact hole is reduced to avoid the problem of voids in the contact structure 108 in the subsequent filling process.

As an example, the thermal expansion coefficient of the first contact layer 206 is not greater than the thermal expansion coefficient of the electrode cover layer 102. During the operation of the semiconductor structure, the temperature of the device will rise. By setting the thermal expansion coefficient of the first contact layer 206 to be no greater than the thermal expansion coefficient of the electrode cover layer 102, the abnormality of cracks and extension in the electrode cover layer 102 caused by the mismatch of the thermal expansion coefficients is avoided.

Further, the thermal expansion coefficient of the second contact layer 208 is not greater than the thermal expansion coefficient of the first conductive structure 104. During the operation of the semiconductor structure, the temperature of the device will rise. By setting the thermal expansion coefficient of the second contact layer 208 to be no greater than the thermal expansion coefficient of the first conductive structure 104, it is avoided that the mismatch of the thermal expansion coefficients causes cracks in the first conductive structure 104 to appear and extend. exception.

As an example, the resistivity of the first conductive structure 104 is smaller than the resistivity of the electrode cover layer 102, for example, the doping concentration of the first conductive structure 104 is greater than the doping concentration of the electrode cover layer 102, the contact structure 108 and the contact structure 108 can be reduced by this setting. The resistivity of the contact resistance between the electrode covering layers 102 reduces the resistance value of the contact resistance.

As an example, the resistivity of the first conductive structure 104 is smaller than the resistivity of the first contact layer 206, for example, the doping concentration of the first conductive structure 104 is not less than the doping concentration of the first contact layer 206, which can also be reduced by this setting. The resistivity of the contact resistance between the contact structure 108 and the electrode covering layer 102 reduces the resistance value of the contact resistance.

11, 13 and 15, as an example, the electrode covering layer 102 includes: an electrode covering structure 210 and an adhesion structure 212, the electrode covering structure 210 is located on the substrate; the adhesion structure 212 is located on the upper surface of the electrode covering structure 210. In the embodiment of the present disclosure, the adhesion between the electrode covering structure 210 and the first conductive structure 104 is increased by providing the adhesion structure 212.

As an example, the material of the electrode covering structure 210 includes at least one of boron-doped polysilicon material and boron-doped silicon germanium material. Further, the material of the electrode covering structure 210 is a boron-doped silicon germanium material.

As an example, the material of the adhesion structure 212 includes at least one of boron-doped silicon material, boron-doped amorphous silicon material, boron-doped polysilicon material, tungsten nitride material, tungsten silicide material, and tungsten silicon nitride material. Further, the material of the adhesion structure 212 is boron-doped polysilicon material.

As an example, the coefficient of thermal expansion of the first contact layer 206 is no greater than the coefficient of thermal expansion of the adhesion structure 212. During the working process of the semiconductor structure, the temperature of the device will increase. By setting the thermal expansion coefficient of the first contact layer 206 to be no greater than the thermal expansion coefficient of the adhesive structure 212, the abnormality of cracks and extension in the adhesive structure 212 caused by the mismatch of the thermal expansion coefficients is avoided.

Referring to FIG. 11, as an example, the lower surface of the first contact layer 206 is higher than the lower surface of the adhesive structure 212, the first conductive layer 404 is located within the adhesive structure 212, and the first barrier layer 402 is located between the first conductive layer 404 and the adhesive structure 212. Between the attachment structures 212; through the provision of the adhesion structure 212, the adhesion between the first conductive structure 104 and the electrode cover layer 102 is increased, and the contact area between the contact structure 108 and the electrode cover layer 102 is increased at the same time, reducing the resistance of the contact resistance.

As an example, the resistivity of the first conductive structure 104 is not greater than the resistivity of the first contact layer 206, for example, the doping concentration of the first conductive structure 104 is not less than the doping concentration of the first contact layer 206, at this time, the first conductive structure The contact portion between the structure 104 and the adhesion structure 212 is equivalent to a portion of the contact area between the contact structure 108 and the electrode covering layer 102, which further reduces the resistance value of the contact resistance.

Further, the resistivity of the adhesion structure 212 is not greater than the resistivity of the electrode covering structure 210, for example, the doping concentration of the adhesion structure 212 is not less than the doping concentration of the electrode covering structure 210, and the resistivity of the first conductive structure 104 is not less than The resistivity of the adhesion structure 212, for example, the doping concentration of the first conductive structure 104 is not greater than the doping concentration of the adhesion structure 212. At this time, the contact area between the contact structure 108 and the electrode cover layer 102 is equivalent to The contact area between the adhesive structure 212 and the electrode covering structure 210 reduces the resistance value of the contact resistance.

Further, the resistivity of the adhesion structure 212 is not greater than the resistivity of the electrode covering structure 210, for example, the doping concentration of the adhesion structure 212 is not less than the doping concentration of the electrode covering structure 210, and the resistivity of the first conductive structure 104 is less than The resistivity of the adhesion structure 212, for example, the doping concentration of the first conductive structure 104 is greater than the doping concentration of the adhesion structure 212, at this time, the contact area between the contact structure 108 and the electrode cover layer 102 is equivalent For the contact area between the first conductive structure 104 and the adhesive structure 212 and the contact area between the contact structure 108 (the first contact layer 206) and the electrode covering structure 210, the volume resistance of the contact structure 108 is reduced, and the contact resistance is reduced. resistance.

13, as an example, the lower surface of the first contact layer 206 is flush with the lower surface of the adhesive structure 212, the first conductive layer 404 is located within the adhesive structure 212, and the first barrier layer 402 is located in the first conductive layer 404 between the adhesion structure 212 and between the first conductive layer 404 and the electrode covering structure 210. Further, the upper surface of the first contact layer 206 is flush with the upper surface of the adhesive structure 212. By disposing the adhesion structure 212, the adhesion between the first conductive structure 104 and the electrode cover layer 102 is increased, the contact area between the contact structure 108 and the electrode cover layer 102 is increased, and the contact resistance is reduced. resistance.

Further, the resistivity of the first conductive structure 104 is not greater than the resistivity of the first contact layer 206, for example, the doping concentration of the first conductive structure 104 is not less than the doping concentration of the first contact layer 206, and the resistance of the adhesion structure 212 The ratio is not greater than the resistivity of the electrode covering structure 210. For example, the doping concentration of the adhesion structure 212 is not less than the doping concentration of the electrode covering structure 210. At this time, the contact portion between the first conductive structure 104 and the adhesion structure 212, the first The contact portion between the contact layer 206 and the adhesive structure 212 and the contact portion between the first contact layer 206 and the electrode cover layer 102 together constitute the contact area between the contact structure 108 and the electrode cover layer 102, which further reduces the resistance of the contact resistance.

Further, the resistivity of the first conductive structure 104 is smaller than the resistivity of the adhesion structure 212, for example, the doping concentration of the first conductive structure 104 is greater than the doping concentration of the adhesion structure 212, which further reduces the contact structure. 108 bulk resistance.

Referring to FIG. 15, as an example, the lower surface of the first contact layer 206 is lower than the lower surface of the adhesive structure 212, the first conductive layer 404 includes a portion located in the adhesive structure 212 and a portion located in the electrode covering structure 210. A barrier layer 402 is located between the first conductive layer 404 and the adhesion structure 212 and between the first conductive layer 404 and the electrode covering structure 210, that is, the bottom of the first contact hole 302 stays inside the electrode covering structure 210, and further, The upper surface of the first contact layer 206 is flush with the upper surface of the adhesive structure 212. By disposing the adhesion structure 212, the adhesion between the first conductive structure 104 and the electrode cover layer 102 is increased, the contact area between the contact structure 108 and the electrode cover layer 102 is increased, and the contact resistance is reduced. resistance.

Further, the resistivity of the first conductive structure 104 is not greater than the resistivity of the first contact layer 206, for example, the doping concentration of the first conductive structure 104 is not less than the doping concentration of the first contact layer 206. The contact portion between the structure 104 and the adhesive structure 212, the contact portion between the first contact layer 206 and the adhesive structure 212, and the contact portion between the first contact layer 206 and the electrode cover layer 102 together constitute the space between the contact structure 108 and the electrode cover layer 102 The contact area further increases the contact area, reduces the resistance value of the contact resistance, and reduces the bulk resistance of the contact structure 108 at the same time. Further, the resistivity of the adhesion structure 212 is not greater than that of the electrode covering structure 210, and the resistivity of the adhesion structure 212 is smaller than that of the first conductive structure 104. At this time, the adhesion structure 212 and the electrode covering structure The contact part of 210, the contact part of the first contact layer 206 and the electrode cover layer 102 together constitute the contact area between the contact structure 108 and the electrode cover layer 102, which further increases the contact area and reduces the resistance value of the contact resistance and the contact structure. 108 bulk resistance.

As an example, the thermal expansion coefficient of the first contact layer 206 is not greater than the thermal expansion coefficient of the first conductive structure 104, and the temperature of the device will increase during the operation of the semiconductor structure. By setting the thermal expansion coefficient of the first contact layer 206 to be no greater than the first conductive structure The thermal expansion coefficient of 104 avoids the abnormality of cracks and extension of the contact surface between the first contact layer 206 and the first conductive structure 104 caused by the mismatch of the thermal expansion coefficient.

Further, the thermal expansion coefficient of the first contact layer 206 is not greater than the thermal expansion coefficient of the adhesion structure 212, and the thermal expansion coefficient of the first contact layer 206 is not greater than the thermal expansion coefficient of the electrode cover layer 102. By this setting, the thermal expansion coefficient mismatch is avoided As a result, an abnormality of cracks and extension occur between the first contact layer 206 and the adhesion structure 212 and/or between the first contact layer 206 and the electrode covering layer 102.

As an example, the first conductive structure 104, the first conductive layer 404, and the second conductive layer 408 are all first material layers, and the first material layers at least include one of the a tungsten material layer, a tungsten-silicon material layer, a tungsten nitride material layer, and a nitride material layer. tungsten silicon material layers.

It should be understood that the steps described are not strictly limited to the order in which they are performed, and that the steps may be performed in other orders, unless explicitly stated herein. Moreover, at least a part of the described steps may include multiple sub-steps or multiple stages. These sub-steps or stages are not necessarily executed and completed at the same time, but may be executed at different times. The order of execution is also not necessarily sequential, but may be performed alternately or alternately with other steps or at least a portion of sub-steps or stages of other steps.

Each disclosed embodiment in this specification is described in a progressive manner, and each disclosed embodiment focuses on the differences from other disclosed embodiments, and the same and similar parts between the various disclosed embodiments can be referred to each other.

The technical features of the above-described embodiments can be combined arbitrarily. For the sake of brevity, all possible combinations of the technical features in the above-described embodiments are not described. However, as long as there is no contradiction between the combinations of these technical features, all should be regarded as the scope described in this specification.

The above-mentioned embodiments only represent several implementations of the embodiments of the present disclosure, and the descriptions thereof are relatively specific and detailed, but should not be construed as a limitation on the scope of the patent application. It should be noted that, for those skilled in the art, without departing from the concept of the present disclosure, several modifications and improvements can be made, which all belong to the protection scope of the present disclosure. Accordingly, the scope of protection of the present disclosure should be determined by the appended claims.

The invention claimed is:

1. A semiconductor structure comprising:
   an electrode cover layer on a substrate and over a capacitor or a capacitor structure or a capacitor array in the substrate;
   a first conductive structure, disposed on an upper surface of the electrode covering layer; and
   a contact structure, comprising a first contact layer and a second contact layer, wherein the first contact layer is in electric contact with the first conductive structure, and wherein a bottom surface of the second contact layer is in electric contact with a top surface of the first contact layer; wherein a width of the first contact layer is greater than a width of the bottom surface of the second contact layer;
   wherein, a lower surface of the contact structure is not lower than a lower surface of the electrode cover layer;
   wherein a resistivity of the first conductive structure is not greater than a resistivity of the contact structure; and
   wherein the resistivity of the first conductive structure is not greater than a resistivity of the electrode cover layer.

2. The semiconductor structure of claim 1, wherein the first contact layer is disposed on an upper surface of the first conductive structure, wherein a thermal expansion coefficient of the first contact layer is not greater than a thermal expansion coefficient of the first conductive structure.

3. The semiconductor structure of claim 2, wherein the semiconductor structure further comprises an insulating layer disposed on the upper surface of the first conductive structure;
   wherein the first contact layer comprises a first conductive layer and a first barrier layer, wherein the first conductive layer is disposed in the insulating layer, and wherein the first barrier layer is disposed between the first conductive layer and the insulating layer, and between the first conductive layer and the first conductive structure; and
   wherein the second contact layer comprises a second conductive layer and a second barrier layer, wherein the second conductive layer is disposed in the insulating layer, and wherein the second barrier layer is disposed between the second conductive layer and the insulating layer, and between the second conductive layer and the first conductive layer.

4. The semiconductor structure of claim 1, wherein the first contact layer is disposed on a lower surface of the first conductive structure;
   wherein the semiconductor structure further comprises an insulating layer disposed on the upper surface of the first conductive structure;
   wherein the first contact layer comprises a first conductive layer and a first barrier layer, wherein the first conductive layer is disposed in the electrode cover layer, and wherein the first barrier layer is disposed between the first conductive layer and the electrode cover layer; and
   wherein the second contact layer comprises a second conductive layer and a second barrier layer, the second conductive layer comprises a portion within the insulating layer and a portion within the first conductive structure, wherein the second barrier layer is disposed between the second conductive layer and the insulating layer, between the second conductive layer and the first conductive structure, and also between the second conductive layer and the first conductive layer.

5. The semiconductor structure of claim 4, wherein the electrode cover layer comprises:
   an electrode cover structure, disposed on the substrate;
   wherein an adhesion structure is disposed on an upper surface of the electrode cover structure.

6. The semiconductor structure of claim 5, wherein a lower surface of the first contact layer is higher than a lower surface of the adhesion structure;
   wherein the first conductive layer is disposed within the adhesion structure;
   wherein the first barrier layer is disposed between the first conductive layer and the adhesion structure;
   wherein a doping concentration of the adhesion structure is not less than a doping concentration of the electrode cover structure, and wherein a doping concentration of the first conductive structure is not greater than the doping concentration of the adhesion structure.

7. The semiconductor structure of claim 5, wherein the lower surface of the first contact layer is flush with a lower surface of the adhesion structure;
   wherein the first conductive layer is disposed within the adhesion structure; and
   wherein the first barrier layer is disposed between the first conductive layer and the adhesion structure, and between the first conductive layer and the electrode cover structure.

8. The semiconductor structure of claim 5, wherein the lower surface of the first contact layer is lower than a lower surface of the adhesion structure;
   wherein the first conductive layer comprises a portion within the adhesion structure and a portion within the electrode cover structure; and
   wherein the first barrier layer is disposed between the first conductive layer and the adhesion structure and between the first conductive layer and the electrode cover structure.

9. The semiconductor structure of claim 1, further comprising:
   a metal wiring layer, wherein the metal wiring layer is disposed on the contact structure and is in electric contact with a top surface of the contact structure;
   wherein the first conductive structure, the first conductive layer, and the second conductive layer each comprises a first material layer, and wherein each of the first material layers at least comprise one of a tungsten material layer, a tungsten silicon material layer, a tungsten nitride material layer, and a tungsten silicon nitride material layer.

10. A method for preparing a semiconductor structure, comprising:
    forming an electrode cover layer on a substrate and over a capacitor or a capacitor structure or a capacitor array in the substrate;
    forming a first conductive structure on an upper surface of the electrode cover layer; and forming an insulating layer on the first conductive structure, and forming a contact structure in the insulating layer;

wherein, the contact structure comprises a first contact layer and a second contact layer;

wherein the first contact layer is in electric contact with the first conductive structure;

wherein a bottom surface of the second contact layer is in electric contact with a top surface of the first contact layer;

wherein a width of the first contact layer is greater than a width of a bottom surface of the second contact layer;

wherein a lower surface of the contact structure is not lower than a lower surface of the electrode cover layer; and wherein a resistivity of the first conductive structure is not greater than a resistivity of the contact structure, and not greater than a resistivity of the electrode cover layer.

11. The method of claim 10, wherein
steps of forming the insulating layer on the first conductive structure, and forming the contact structure in the insulating layer comprise:
forming a first insulating layer on an upper surface of the first conductive structure;
forming a first contact hole in the first insulating layer;
forming the first contact layer in the first contact hole;
forming a second insulating layer on an upper surface of the first insulating layer and the upper surface of the first contact layer;
forming a second contact hole in the second insulating layer, wherein the second contact hole exposes the first contact layer, and wherein a width of a bottom surface of the second contact hole is smaller than the width of the first contact layer; and
wherein the second contact layer is formed in the second contact hole.

12. The method according to claim 10, wherein, also comprises:
forming a metal connection layer on the insulating layer, wherein the metal connection layer is in contact with a top surface of the contact structure;
wherein the first conductive structure, the first contact layer, and the second contact layer each comprises a first material layer, wherein the first material layer at least comprises one of a tungsten material layer, a tungsten silicon material layer, a tungsten nitride material layer, and a tungsten silicon nitride material layer; and
wherein a thermal expansion coefficient of the first contact layer is not greater than a thermal expansion coefficient of the first conductive structure.

13. A method for fabricating a semiconductor structure, comprising:
forming an electrode cover layer on a substrate and over a capacitor or a capacitor structure or a capacitor array in the substrate;
forming a first contact layer in the electrode cover layer;
forming a first conductive structure on an upper surface of the electrode cover layer and an upper surface of the first contact layer;
forming an insulating layer on the first conductive structure; and
forming a second contact layer in the insulating layer and the first conductive structure, wherein a bottom surface of the second contact layer is in electric contact with a top surface of the first contact layer;

wherein a contact structure comprises the first contact layer and the second contact layer;

wherein a width of the first contact layer is greater than a width of the bottom surface of the second contact layer;

wherein a lower surface of the contact structure is not lower than a lower surface of the electrode covering layer; and wherein a resistivity of the first conductive structure is not greater than a resistivity of the contact structure and is not greater than a resistivity of the electrode covering layer.

14. The method according to claim 13, wherein
the electrode cover layer comprises: an electrode cover structure and an adhesion structure sequentially stacked from a substrate, and wherein a step of forming the electrode cover layer on the substrate comprises:
forming an electrode cover structure on the substrate; and
forming an adhesion structure on an upper surface of the electrode cover structure.

15. The method according to claim 14, wherein
a step of forming the first contact layer in the electrode cover layer comprises:
forming a first contact hole in the adhesion structure, wherein a bottom surface of the first contact hole is higher than a lower surface of the adhesion structure; and
forming the first contact layer in the first contact hole;
wherein, a doping concentration of the adhesion structure is not less than a doping concentration of the electrode cover structure, and a doping concentration of the first conductive structure is not greater than a doping concentration of the adhesion structure.

16. The method according to claim 14, wherein
a step of forming the first contact layer in the electrode cover layer comprises:
forming a first contact hole in the adhesive structure, wherein the first contact hole exposes the upper surface of the electrode cover structure; and
formed the first contact layer in the first contact hole.

17. The method according to claim 14, wherein
a step of forming the first contact layer in the electrode cover layer comprises:
forming a first contact hole in the adhesion structure and the electrode cover structure, wherein the first contact hole penetrates the adhesion structure and extends into the electrode cover layer; and
forming the first contact layer in the first contact hole.

18. The method according to claim 13, further comprising:
forming a metal connection layer on the insulating layer, wherein the metal connection layer is in electric contact with a top surface of the contact structure;
wherein the first conductive structure, the first contact layer, and the second contact layer each comprises a first material layer, wherein the first material layer at least comprises one of a tungsten material layer, a tungsten silicon material layer, a tungsten nitride material layer, and a tungsten silicon nitride material layer; and
wherein a thermal expansion coefficient of the first contact layer is not greater than a thermal expansion coefficient of the first conductive structure.

* * * * *